(12) United States Patent
Shao et al.

(10) Patent No.: US 12,369,305 B2
(45) Date of Patent: Jul. 22, 2025

(54) SEMICONDUCTOR STRUCTURE, METHOD FOR MANUFACTURING SAME AND MEMORY

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 490 days.

(21) Appl. No.: 17/944,814

(22) Filed: Sep. 14, 2022

(65) Prior Publication Data

US 2023/0014198 A1 Jan. 19, 2023

(30) Foreign Application Priority Data

Jun. 21, 2022 (CN) .......................... 202210707418.0

(51) Int. Cl.
 *H01L 27/108* (2006.01)
 *H10B 12/00* (2023.01)

(52) U.S. Cl.
 CPC ............ *H10B 12/30* (2023.02); *H10B 12/05* (2023.02); *H10B 12/482* (2023.02)

(58) Field of Classification Search
 CPC ...... H10B 12/30; H10B 12/05; H10B 12/482; H10B 12/0383; H10B 12/0387; H10B 12/395; H10D 62/112; H10D 62/115
 See application file for complete search history.

(56) References Cited

U.S. PATENT DOCUMENTS

| | | |
|---|---|---|
| 5,571,730 A | 11/1996 | Park |
| 2005/0285176 A1 | 12/2005 | Kim |
| 2008/0035976 A1 | 2/2008 | Kim |
| 2010/0295110 A1 | 11/2010 | Takaishi |
| 2011/0244302 A1 | 10/2011 | Wasson |
| 2012/0156844 A1 | 6/2012 | Kim |
| 2013/0148260 A1 | 6/2013 | Wasson |
| 2013/0234240 A1 | 9/2013 | Moon et al. |

(Continued)

FOREIGN PATENT DOCUMENTS

| | | |
|---|---|---|
| CN | 1767199 A | 5/2006 |
| CN | 101874303 A | 10/2010 |

(Continued)

*Primary Examiner* — Mohammed R Alam
(74) *Attorney, Agent, or Firm* — Syncoda LLC; Feng Ma

(57) ABSTRACT

A semiconductor structure, a method for manufacturing the same and a memory are provided. The semiconductor structure includes a substrate, multiple first active pillars above the substrate, a memory structure, multiple transistors, and multiple second active pillars. The multiple first active pillars are arranged in an array along a first direction and a second direction. The substrate includes an isolation structure on which the first active pillars are located. The memory structure includes first electrode layers, a dielectric layer and a second electrode layer. The first electrode layer covers a sidewall of the first active pillar, the dielectric layer covers at least surfaces of the first electrode layers, the second electrode layer covers a surface of the dielectric layer. Each of the second active pillars is located above a corresponding one of the first active pillars; a channel structure of each transistor is located in the second active pillar.

16 Claims, 33 Drawing Sheets

(56) References Cited

U.S. PATENT DOCUMENTS

| | | |
|---|---|---|
| 2014/0035018 A1 | 2/2014 | Lee |
| 2015/0001617 A1 | 1/2015 | Kim et al. |
| 2015/0348976 A1 | 12/2015 | Moon et al. |
| 2018/0308923 A1 | 10/2018 | Wu et al. |
| 2019/0067288 A1* | 2/2019 | Juengling ............ H10D 30/63 |
| 2019/0103407 A1 | 4/2019 | Kim et al. |
| 2019/0189617 A1 | 6/2019 | Ltd |
| 2019/0206982 A1 | 7/2019 | Wu et al. |
| 2019/0252387 A1 | 8/2019 | Moon et al. |
| 2019/0273081 A1 | 9/2019 | Moon et al. |
| 2020/0111793 A1 | 4/2020 | Kim et al. |
| 2020/0243532 A1 | 7/2020 | Kim et al. |
| 2021/0057416 A1 | 2/2021 | Kim et al. |
| 2021/0066306 A1 | 3/2021 | Tang et al. |
| 2021/0151440 A1 | 5/2021 | Tang et al. |
| 2021/0202485 A1 | 7/2021 | Inaba |
| 2021/0202490 A1 | 7/2021 | Cho et al. |
| 2022/0013525 A1* | 1/2022 | Cho ..................... H10B 12/05 |
| 2022/0052151 A1 | 2/2022 | Wang |
| 2022/0173109 A1 | 6/2022 | Rigano |
| 2022/0246621 A1 | 8/2022 | Cho et al. |

FOREIGN PATENT DOCUMENTS

| | | |
|---|---|---|
| CN | 103311249 A | 9/2013 |
| CN | 108735744 A | 11/2018 |
| CN | 109065501 A | 12/2018 |
| CN | 109616474 A | 4/2019 |
| CN | 113078116 A | 7/2021 |
| CN | 113611671 A | 11/2021 |
| CN | 113707614 A | 11/2021 |
| CN | 114068414 A | 2/2022 |
| CN | 114078777 A | 2/2022 |
| CN | 114093821 A | 2/2022 |
| CN | 114256240 A | 3/2022 |
| CN | 114342065 A | 4/2022 |
| CN | 114373764 A | 4/2022 |
| CN | 114551450 A | 5/2022 |
| CN | 114582808 A | 6/2022 |
| JP | H0864777 A | 3/1996 |
| JP | 2013168570 A | 8/2013 |

* cited by examiner

SEMICONDUCTOR STRUCTURE, METHOD FOR MANUFACTURING SAME AND MEMORY

CROSS-REFERENCE TO RELATED APPLICATION

The present application claims priority to Chinese Patent Application No. 202210707418.0 filed on Jun. 21, 2022, the disclosure of which is hereby incorporated by reference in its entirety.

BACKGROUND

Memory array architecture of dynamic random access memory (DRAM) is an array composed of a memory cell including a transistor and a capacitor (that is, 1T1C memory cell). The gate of the transistor is connected to a word line, the drain is connected to a bit line, and the source is connected to a capacitor.

As a dimension of DRAM keeps shrinking, so does dimension of capacitors. How to guarantee the performance of the capacitors in DRAM has become an urgent problem to be solved.

SUMMARY

The invention relates to the technical field of semiconductors, in particular to a semiconductor structure, a method for manufacturing the same and a memory.

According to one aspect of the present disclosure, a semiconductor structure is provided.

The semiconductor structure includes a substrate, a plurality of first active pillars above the substrate, a memory structure, a plurality of transistors, and a plurality of second active pillars.

The plurality of first active pillars are arranged in an array along a first direction and a second direction; the first direction and the second direction are perpendicular to an extension direction of the first active pillars, and the first direction and the second direction intersect; the substrate includes an isolation structure on which the plurality of the first active pillars are located.

The memory structure includes first electrode layers, a dielectric layer and a second electrode layer; the first electrode layers cover sidewalls of the first active pillars, the dielectric layer covers at least surfaces of the first electrode layers, the second electrode layer covers a surface of the dielectric layer, and bottoms of the dielectric layer and the second electrode layer are embedded in the isolation structure.

Each of the second active pillars is located above a corresponding one of the first active pillars, a channel structure of each of the transistors is located in each of the second active pillars, and an extension direction of the channel structure is same as an extension direction of the second active pillars.

According to another aspect of the present disclosure, a memory is provided and the memory includes at least one semiconductor structure as described in any solution of the above-mentioned solutions of the present disclosure.

According to yet another aspect of the present disclosure, a method for manufacturing a semiconductor structure is provided, and the method includes the following operations.

A substrate is provided, an isolation structure is formed on the substrate, and a plurality of first active pillars arranged in an array along a first direction and a second direction are formed on the isolation structure. The first direction and the second direction are both perpendicular to an extension direction of the first active pillars, and the first direction and the second direction intersect.

A memory structure surrounding sidewalls of the first active pillars is formed and the memory structure includes first electrode layers, a dielectric layer and a second electrode layer, each of the first electrode layers covers a sidewall of each of the first active pillars, the dielectric layer covers at least surfaces of the first electrode layers, the second electrode layer covers a surface of the dielectric layer, and bottoms of the dielectric layer and the second electrode layer are embedded in the isolation structure.

A plurality of second active pillars are formed. Each of the second active pillars is located above a corresponding one of the first active pillars.

A plurality of transistors are formed, a channel structure of each of the transistors is located in each of the second active pillars, and an extension direction of the channel structure is same as an extension direction of the second active pillars.

DETAILED DESCRIPTION

Figure 1:
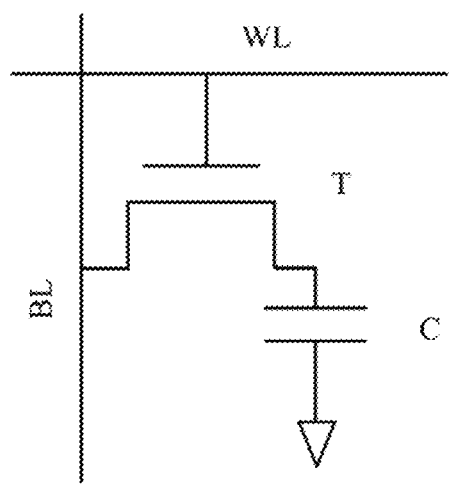
FIG. 1 is a schematic diagram of circuit connection of a transistor of a DRAM provided by an embodiment of the present disclosure.

In order to make the technical solution and advantages of the embodiments of the present disclosure clearer, the technical solution of the disclosure will be further explained in detail below with reference to the accompany drawings and embodiments. Although exemplary embodiments of the disclosure are shown in the drawings, it is to be understood that the disclosure may be embodied in various forms and should not be limited by the embodiments set forth herein. On the contrary, these embodiments are provided to enable a more thorough understanding of the disclosure and to fully convey the scope of the disclosure to those skilled in the art.

The disclosure are described in more detail by way of example in the following paragraphs with reference to the accompany drawings. The advantages and features of the disclosure will become clearer from the following description and claims. It is to be noted that the drawings are in a very simplified form with inaccurate proportions, and the drawings are only used to facilitate and clearly assist in illustrating the purposes of the embodiments of the disclosure.

It is understood that the meanings of "on", "up" and "above" of the disclosure should be interpreted in the widest manner, so that "on" not only means the meaning of "on" something without an intervening feature or a layer (that is, directly on something), but also includes the meaning of "on" something with an intervening feature or a layer.

In addition, for ease of description, spatial relative terms such as "on", "up", "above", "over", "top" and the like may be used herein to describe a relationship between one element or feature and another element or feature as shown in the drawings. In addition to the orientations depicted in accompany drawings, the spatial relative terms are intended to encompass different orientations of a device in use or operation. The device may be oriented in other ways (rotated 90 degrees or in other orientations) and similarly the spatial relative descriptors used herein may be interpreted accordingly.

In the embodiments of the disclosure, the term "substrate" refers to a material on which a subsequent layer of material is added. The substrate itself may be patterned. The material added on the top of the substrate may be patterned or may remain unpatterned. In addition, the substrate may include a variety of semiconductor materials, such as silicon, silicon germanium, germanium, gallium arsenide, indium phosphide, and the like. Alternatively, the substrate may be made of a non-conductive material, such as glass, plastic or sapphire wafer.

In the embodiments of this disclosure, the term "layer" refers to a material part that includes a region having a thickness. The layer may extend on the entirety of a lower or upper structure, or may have a range smaller than a range of the lower or upper structure. Further, the layer may be a region of a homogeneous or heterogeneous continuous structure whose thickness is less than a thickness of a continuous structure. For example, the layer may be located between a top surface and a bottom surface of the continuous structure, or the layer may be located between any pair of horizontal surfaces at the top and bottom surfaces of the continuous structure. The layer may extend horizontally, vertically, and/or along an inclined surface. The layer may include multiple sublayers. For example, a interconnect layer may include one or more conductors and contact sublayers in which interconnect lines and/or via contacts are formed, and one or more dielectric sublayers.

In the embodiments of the disclosure, the terms "first", "second" and the like are used to distinguish similar objects and need not be used to describe a particular order or priority.

The embodiments of the disclosure relates to a semiconductor structure, which is at least a part of the structure that will be used in subsequent processes to form a final device structure. The final device may include a memory, the memory includes, but not limited to dynamic random access memory, and the following only takes the dynamic random access memory as an example for description.

However it should be noted that the following description of DRAM in the embodiments is intended only to illustrate the present disclosure and is not intended to limit the scope of the present disclosure.

With the development of DRAM technology, a dimension of a memory cell becomes smaller and smaller, and its array architecture is changed from 8F2 to 6F2 and then to 4F2. In addition, based on a demand for ions and leakage current in DRAM, the architecture of the memory changes from planar array transistor to recess gate array transistor, and then from recess gate array transistor to buried channel array transistor, and then from buried channel array transistor to vertical channel array transistor.

In some embodiments of the present disclosure, whether it is planar transistor, recess gate array transistor, buried transistor or vertical gate transistor, the DRAM is composed of multiple memory cell structures, and each of the memory cell structures is mainly composed of one transistor and one memory cell (memory capacitor) controlled by the transistor, that is, the DRAM includes the architecture of one transistor (T) and one capacitor (C) (1T1C). Its main action principle is to use an amount of charge stored in the capacitor to represent whether a binary bit (bit) is 1 or 0.

FIG. 1 is a schematic diagram of circuit connection using the architecture of 1T1C provided by an embodiment of the present disclosure. As shown in FIG. 1, the drain of a transistor T is electrically connected with a bit line (BL), the source of the transistor T is electrically connected with one of the electrode plates of a capacitor C, the other electrode plate of the capacitor C may be connected with the reference voltage, which can be a ground voltage or another voltage, and the gate of the transistor T is connected with a word line (WL). A voltage is applied through a word line WL to control the transistor T to be turned on or off, and the bit line BL is used to perform the read or write operations on the transistor T when the transistor T is turned on.

However, with development of the memory, the dimension of DRAM is shrinking and the storage capacity of the memory is increasing, so that the process for forming the capacitor becomes more and more difficult and there is a collapse problem, and at the same time there is a leakage problem in the use of the capacitor.

Figure 2:
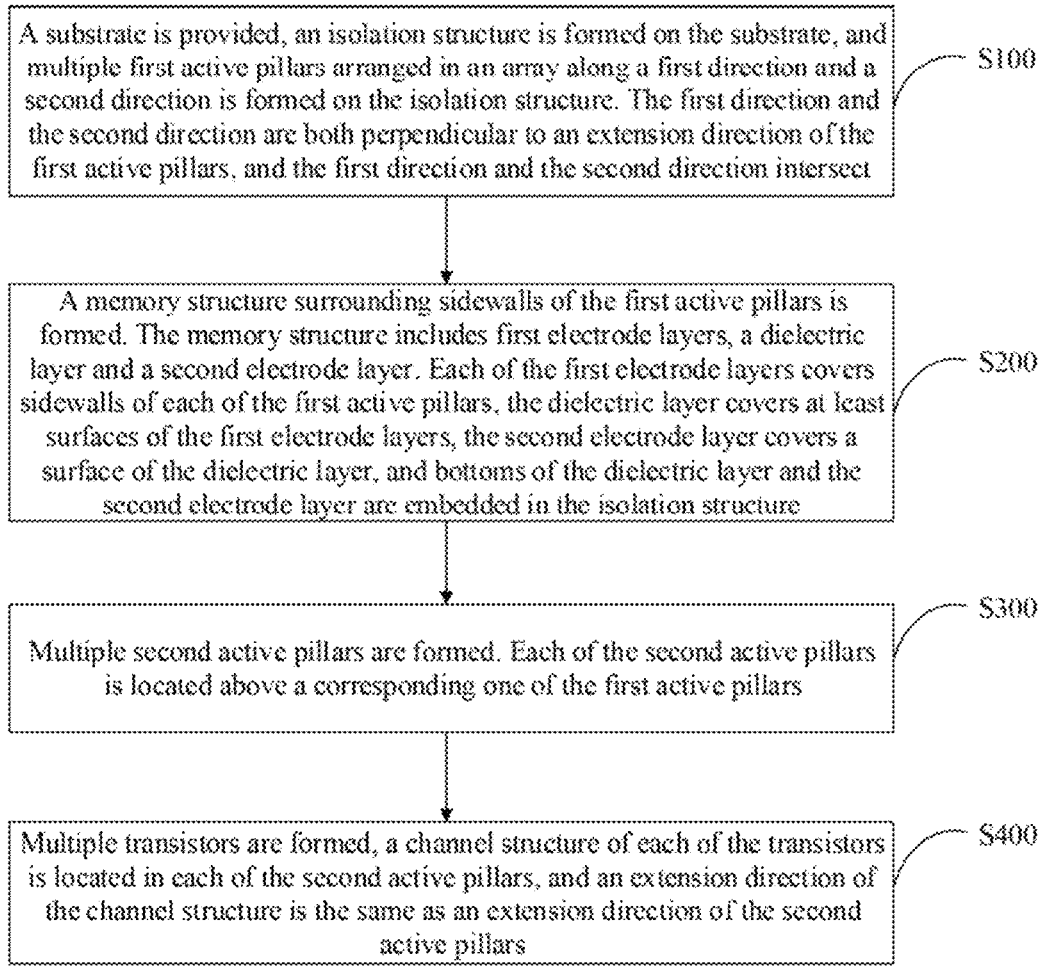
FIG. 2 is a schematic flow chart of a method for manufacturing a semiconductor structure provided by an embodiment of the disclosure.

Based on this, in order to solve one or more of the above problems, the embodiments of the present disclosure provide a method for manufacturing a semiconductor structure, which can mitigate the collapse problem and at the same time can mitigate the leakage problem existing in the use of the capacitor. FIG. 2 is a schematic flow chart flow diagram of a method for manufacturing a semiconductor structure provided by an embodiment of the disclosure. As shown in FIG. 2, the method for manufacturing a semiconductor structure provided by an embodiment of the disclosure includes the following operations.

In S100, a substrate is provided, an isolation structure is formed on the substrate, and multiple first active pillars arranged in an array along a first direction and a second direction are formed on the isolation structure. The first direction and the second direction are both perpendicular to an extension direction of the first active pillars, and the first direction and the second direction intersect.

In S200, a memory structure surrounding sidewalls of the first active pillars is formed. The memory structure includes first electrode layers, a dielectric layer and a second electrode layer. Each of the first electrode layers covers a sidewall of each of the first active pillars, the dielectric layer covers at least surfaces of the first electrode layers, the second electrode layer covers a surface of the dielectric layer, and bottoms of the dielectric layer and the second electrode layer are embedded in the isolation structure.

In S300, multiple second active pillars are formed. Each of the second active pillars is located above a corresponding one of the first active pillars.

In S400, multiple transistors are formed, a channel structure of each of the transistors is located in each of the second active pillars, and an extension direction of the channel structure is the same as an extension direction of the second active pillars.

It is to be understood that the operations shown in FIG. 2 are not exclusive and that other operations may be performed before, after, or between any of the operations shown. The sequence of the operations shown in FIG. 2 can be adjusted according to actual needs. FIGS. 3 to 33 are schematic cross-sectional diagrams of a semiconductor structure during a manufacturing process provided by an embodiment of the disclosure. It should be noted that FIGS. 3 to 33 are schematic diagrams of complete realization process showing the method for manufacturing a semiconductor structure, and parts not marked in part of the accompany drawings can be shared with each other. The method for manufacturing a semiconductor structure provided by the embodiment of the disclosure is described in detail with reference to FIG. 2 and FIGS. 3 to 33.

In S100, the isolation structure and the first active pillars are mainly formed on the substrate.

In some embodiments, forming the isolation structure on the substrate includes the following operations.

A doped semiconductor layer is formed by doping a bottom of the substrate. Multiple first trenches arranged at intervals along the first direction and multiple second trenches arranged at intervals along the second direction are formed in the substrate. Bottoms of the first trenches and the second trenches are both located in the doped semiconductor layer.

The bottom of each of the first trenches and/or the bottom of each of the second trenches are enlarged to form multiple first semiconductor pillars, and each of the first semiconductor pillars includes a first portion and a second portion located on the first portion. A maximum radial width of the first portion is less than a minimum radial width of the second portion.

An oxidation treatment is performed on the first semiconductor pillars, so that the first portions is completely oxidized to form oxide pillars, exposed surfaces of the second portions is oxidized to form first oxide layers, and a surface of the doped semiconductor layer is oxidized to form a second oxide layer. Un-oxidized part of doped semiconductor layer, the oxide pillars, and the second oxide layer together constitute the isolation structure.

In some embodiments, a doping type of the doped semiconductor layer is different from a doping type of the first semiconductor pillars.

In some embodiments, the method for manufacturing a semiconductor structure further includes forming a top supporting layer on the substrate. Forming the top supporting layer includes the following operations.

A first insulating layer is filled in each of the first trenches after forming the first trenches.

Part of each of the first insulating layers is removed to form a first groove. A bottom surface of the first groove is lower than the top surface of the substrate.

A first supporting material layer covering the first grooves and the top of the substrate is formed.

The multiple second trenches arranged at intervals along the second direction in the substrate are formed by etching the first supporting material layer and the substrate. A second insulating layer is filled in each of the second trenches.

Part of each of the second insulating layers is removed to form multiple second grooves arranged in an array along the first direction and the second direction. Bottom surfaces of the second grooves are flush with the bottom surfaces of the first grooves.

The second grooves are filled to form a second supporting material layer. The first supporting material layer and the second supporting material layer form the top supporting layer.

The formation process of the isolation structure and the first active pillars are described in detail below with reference to FIGS. 3 to 15.

Figure 3:
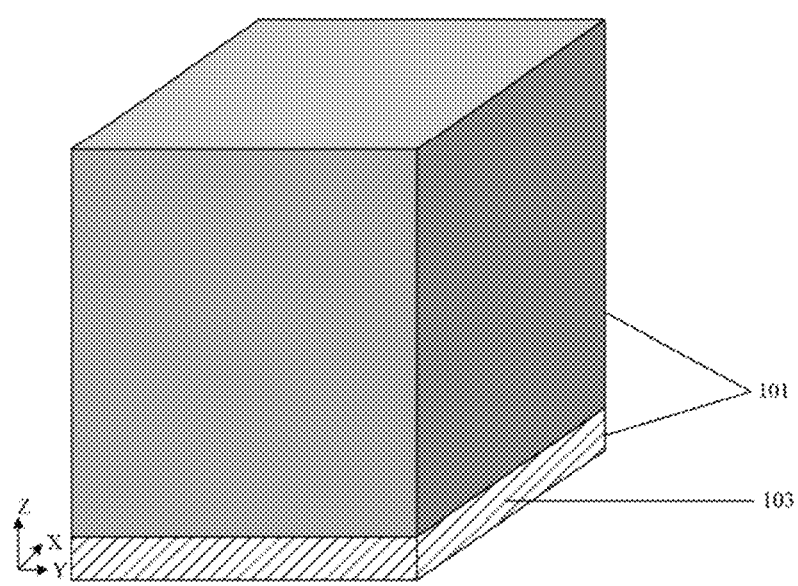
FIGS. 3 to 33 are schematic cross-sectional diagrams of a semiconductor structure during a manufacturing process provided in an embodiment of the disclosure.

As shown in FIG. 3, the bottom of the substrate 101 is doped to form the doped semiconductor layer 103.

In some specific examples, the substrate 101 may include an elemental semiconductor material substrate (for example, silicon (Si) substrate, germanium (Ge) substrate, or the like), a composite semiconductor material substrate (for example, silicon germanium (SiGe) substrate, or the like), a silicon on insulator (SOI) substrate, a germanium on insulator (GeOI) substrate, or the like. Preferably, the substrate is a silicon substrate.

In some specific examples, the method further includes doping part of the substrate 10t other than the bottom, and a doping type of the bottom of the substrate 101 is different from a doping type of the part other than the bottom of the substrate 101.

For example, when the doping type of the bottom of the substrate 101 is N type, the doping type of the part other than the bottom of the substrate 101 is P type. When the doping type of the bottom of the substrate 101 is P-type, the doping type of the part other than the bottom of the substrate 101 is N-type.

For example, when the doping type is P-type doping, a P-type impurity source may be boron (B), aluminum (Al), or the like, and the P-type impurity source is not limited thereto. When the doping type is N-type doping, an N-type impurity source may be phosphorus (P), arsenic (As), or the like, and the N-type impurity source is not limited thereto.

In some specific examples, methods for doping the part of the substrate 101 other than the bottom and doping the bottom of the substrate 101 include, but are not limited to ion implantation and diffusion.

In some specific examples, a doping concentration of the bottom of the substrate 101 is less than a doping concentration of the part of the substrate 101 other than the bottom.

It is to be understood that the doping treatment is performed on the bottom of the substrate 101, in order to make the doped semiconductor layer 103 to constitute a depletion region, thereby being able to mitigate the leakage problem of the memory structure 106 formed in the subsequent process.

Figure 4:
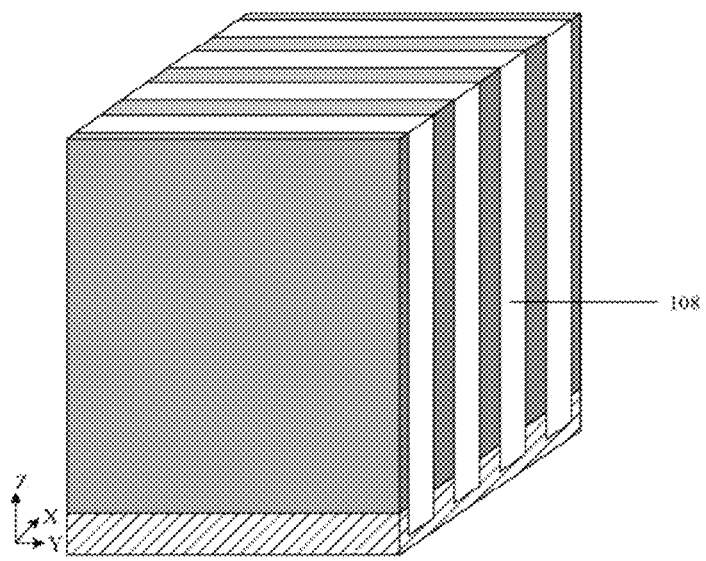

Next as shown in FIG. 4, a surface of the substrate 101 is etched to form multiple first trenches 108 arranged at intervals in the first direction in the substrate 101. Bottoms of the first trenches 108 are located in the doped semiconductor layer 103. Each of the first trenches 108 extends in the second direction.

The first direction is parallel to the surface of the substrate 101. The second direction intersects the first direction and is parallel to the surface of the substrate 101. The third direction is the extension direction of first semiconductor pillars 105 and is perpendicular to the surface of the substrate 101.

The first direction intersects the second direction, and it is to be understood that the included angle between the first direction and the second direction is 0-90 degrees.

In order to clearly describe the present disclosure, the following embodiment is described with the first direction perpendicular to the second direction as an example. For example, the first direction is X-axis direction shown in FIG. 3. The second direction is Y-axis direction shown in FIG. 3. The third direction is Z-axis direction shown in FIG. 3. However it should be noted that the following description of the directions in the embodiments is intended only to illustrate the present disclosure and is not intended to limit the scope of the present disclosure.

In some specific examples, the first trenches 108 include but are not limited to shallow trench isolation (STI) structures.

In some specific examples, a method for forming the first trenches 108 includes but is not limited to a dry plasma etching process.

Figure 5:
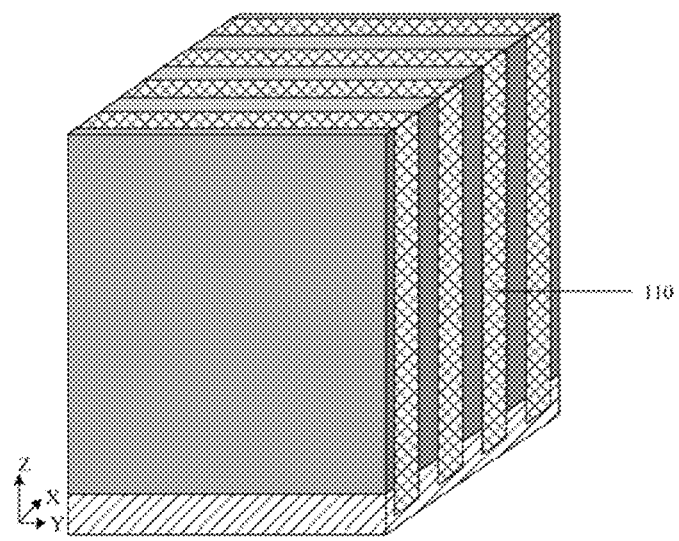

As shown in FIG. 5, a first insulating layer 110 is formed in each of the first trenches 108. Top surfaces of the first insulating layers 110 are substantially flush with the top surface of the substrate 101. The first insulating layers 110 are used to play a supporting role.

It is to be noted that "substantially flush" referred to in this disclosure may be understood as "roughly flush". It is to be understood that misalignment or not being flush due to process errors during manufacturing a memory is also included in the range of "substantially flush".

In some specific examples, a constituent material of the first insulating layers 110 includes but is not limited to silicon oxide ($SiO_2$).

In some specific examples, a method for forming the first insulating layer 110 includes, but is not limited to a physical vapor deposition (PVD) process, a chemical vapor deposition (CVD) process, an atomic layer deposition (ALD) process, and the like.

Figure 6:
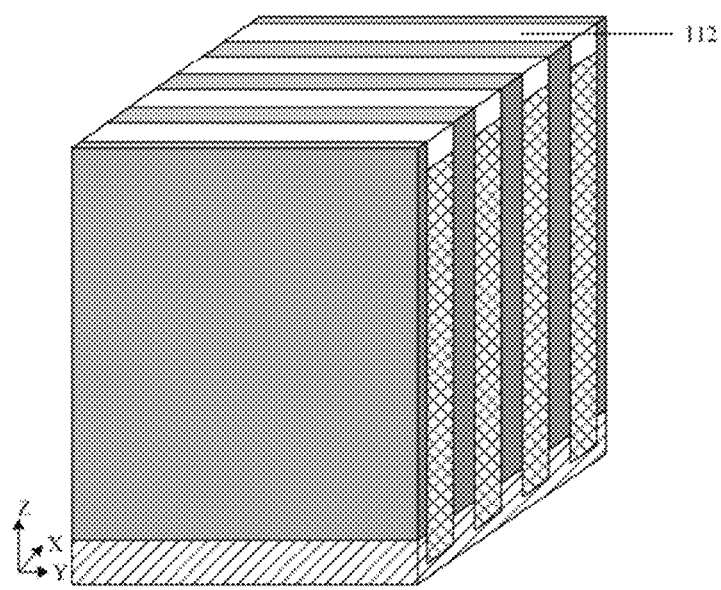

As shown in FIG. 6, parts of the first insulating layers 110 are removed to form first grooves 112. Bottom surfaces of the first grooves 112 are lower than the top surface of the substrate 101, that is, the first grooves 112 are formed in the substrate 101.

In some specific examples, a projection of the first grooves 112 and a projection of the first trenches 108 in a first plane coincide. The first plane is a plane perpendicular to the third direction.

In some specific examples, a method for removing parts of the first insulating layers 110 includes but is not limited to a dry etching process and a wet etching process.

Figure 7:
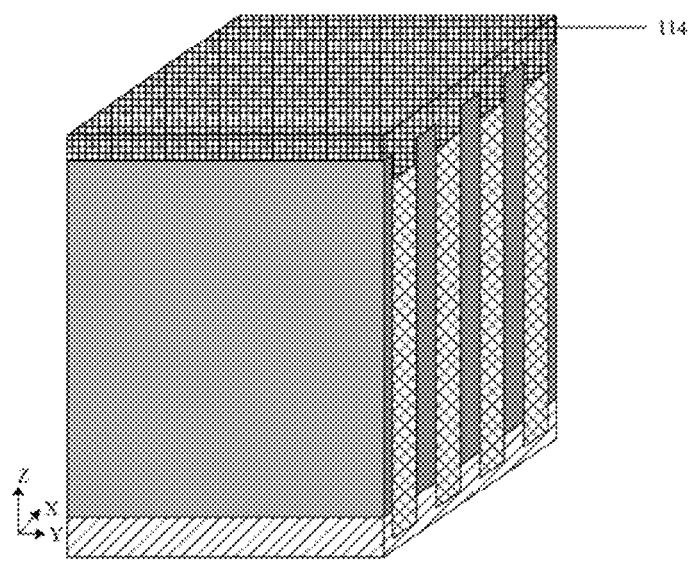

As shown in FIG. 7, a material of the first supporting material layer 114 is filled in the first grooves 112 and on the substrate 101, thereby forming the first supporting material layer 114 which covers the first grooves 112 and the top of the substrate 101.

In some specific examples, a constituent material of the first supporting material layer 114 includes but is not limited to silicon nitride.

In some specific examples, a method for forming the first supporting material layer 114 includes, but is not limited to PVD, CVD, ALD.

In some specific examples, after filling the material of the first supporting material layer 114, performing a planarization treatment on the first supporting material layer 114 is further included, to make a surface of the first supporting material layer 114 flat.

In some specific examples, the planarization process includes but is not limited to chemical mechanical polishing (CMP).

It is to be understood that, the formation of the first supporting material layer 114 on the top surface of the substrate 101 can protect the top surface of the substrate 101, to prevent the top of the substrate 101 from being consumed in a subsequent process.

Figure 8:
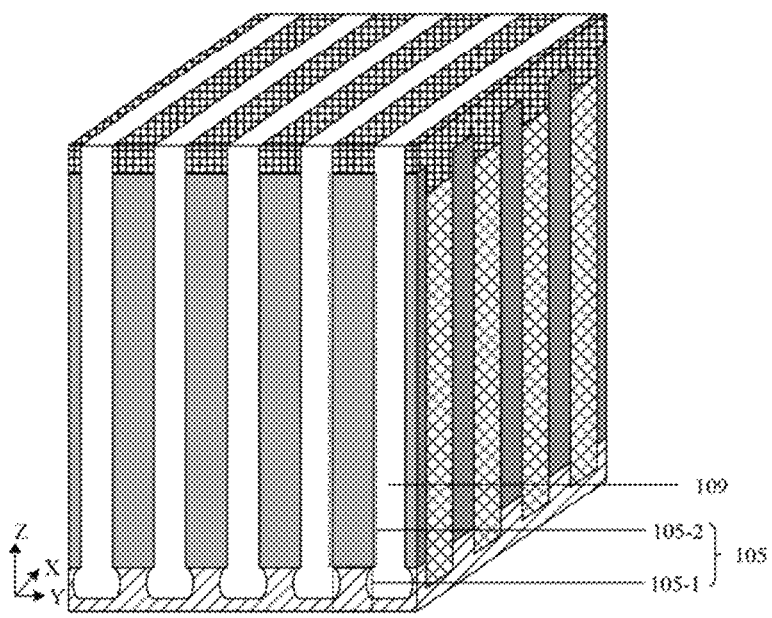

As shown in FIG. 8, the first supporting material layer 114 and the substrate 101 are etched to form multiple second trenches 109 arranged at intervals in the second direction in the substrate 101. Bottoms of the second trenches 109 are located in the doped semiconductor layer 103. The multiple second trenches 109 are arranged at intervals along the second direction. Each of the second trenches 109 extends along the first direction, that is, the first trenches 108 and the second trenches 109 intersect.

In some specific examples, the first trenches 108 and the second trenches 109 are perpendicular to each other when the first direction is perpendicular to the second direction.

In some specific examples, the multiple first trenches 108 are arranged at intervals in the X-axis direction. Each of the first trenches 108 extends in the Y-axis direction. The multiple second trenches 109 are arranged at intervals in the Y-axis direction. Each of the second trenches 109 extends in the X-axis direction.

In some specific examples, a method for forming the second trenches 109 includes but is not limited to a dry plasma etching process.

In some specific examples, the second trenches 109 include but are not limited to shallow trench isolation (STI) structures.

The first trenches 108 and the second trenches 109 divide the substrate 101 into the multiple first semiconductor pillars 105 arranged in an array along the first direction and the second direction.

As shown in FIG. 8, bottoms of each of the first trenches 108 and/or each of the second trenches 109 are subjected to an enlargement process. The enlargement process can be understood as etching the bottoms of the first trenches 108 in the first direction, and/or, etching the bottoms of the second trenches 109 in the second direction. By doing so, radial widths of the bottoms of the first trenches 108 and/or the second trenches 109 in the first direction are larger than radial widths of tops of the corresponding trenches in the first direction; and/or, radial widths of the bottoms of the first trenches 108 and/or the second trenches 109 in the second direction are larger than radial widths of the tops of the corresponding trenches in the second direction.

In some specific examples, the adopted etching process may include a wet etching process, a dry etching process, and the like.

For example, in the wet etching process, an etchant is introduced into the bottoms of the first trenches 108 and/or the second trenches 109. By anisotropic etching of the etchant, radial widths of the bottoms of the first trenches 108 and/or the second trenches 109 in the X-axis direction are increased, and/or the radial widths of the bottom of the first trench 108 and/or the second trench 109 in the Y-axis direction are increased.

For example, in the dry etching process, lateral etching is performed by controlling plasma to form trench structures with enlarged radial widths at the bottoms of the first trenches 108 and/or the second trenches 109.

In an embodiment of the present disclosure, the etching process causes bottom regions of the multiple first pillars 105 on the substrate 101 to be etched and the bottom regions of the first semiconductor pillars 105 to be reduced in size, after a process of the enlargement process on the bottom of each of the first trenches 108 and/or the second semiconductor trenches 109.

In other words, each of the first semiconductor pillars 105 includes a first portion 105-1 and a second portion 105-2 located on the first portion 105-1. The second portion 105-2 of the first semiconductor pillar 105 is located above the first portion 105-1 of the first semiconductor pillar 105.

For example, when only the first trenches 108 are subjected to the enlargement process, a maximum radial width of the first portion 105-1 of the first semiconductor pillar 105 in the X-axis direction is smaller than a minimum radial width of the second portion 105-2 of the first semiconductor pillar 105 in the X-axis direction.

For example, when only the second trenches 109 are subjected to the enlargement process, a maximum radial width of the first portion 105-1 of the first semiconductor pillar 105 in the Y-axis direction is smaller than a minimum radial width of the second portion 105-2 of the first semiconductor pillar 105 in the Y-axis direction.

For example, when both the first trenches 108 and the second trenches 109 are subjected to the enlargement process, a maximum radial width of the first portion 105-1 of the first semiconductor pillar 105 in the X-axis direction is smaller than a minimum radial width of the second portion 105-2 of the first semiconductor pillar 105 in the X-axis direction, and a maximum radial width of the first portion 105-1 of the first semiconductor pillar 105 in the Y-axis direction is smaller than a minimum radial width of the second portion 105-2 of the first semiconductor pillar 105 in the Y-axis direction.

Preferably, both the first trenches 108 and the second trenches 109 are subjected to the enlargement process, to make the sizes of the first portions 105-1 of the first semiconductor pillars 105 reduced.

For example, the maximum radial width of the first portion 105-1 may be understood as the radial width at the position where the first portion 105-1 of the first semiconductor pillar 105 contacts the second portion 105-2 of the first the semiconductor pillar 105 in FIG. 8. The minimum radial width of the second portion 105-2 may be understood as the radial width of the smallest region in the second portion 105-2 of the first semiconductor pillar 105. Referring to FIG. 8, an upper portion and a lower portion of the second portion 105-2 of the first semiconductor pillar 105 have the same size, that is, the minimum radial width and the maximum radial width of the second portion 105-2 of the first semiconductor pillar 105 are the same.

Figure 9:
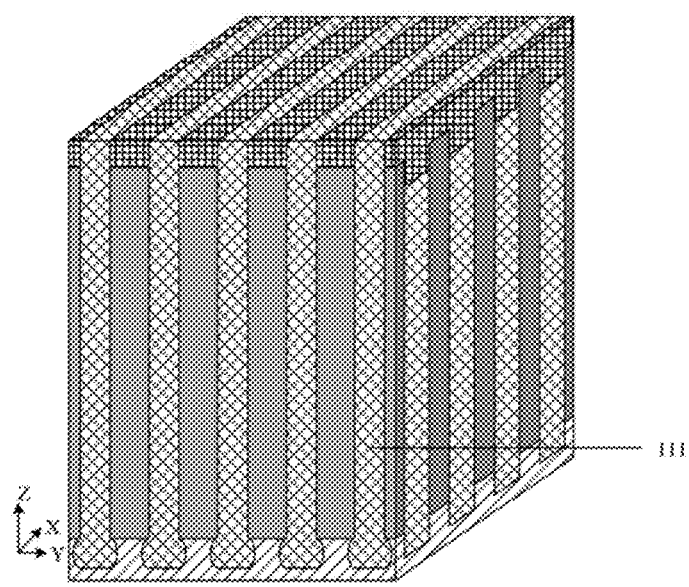

As shown in FIG. 9, a second insulating layer 111 is formed in each of the second trenches 109. The second insulating layers 111 are used for supporting.

In some specific examples, a constituent material of the second insulating layers 111 includes but is not limited to silicon oxide ($SiO_2$).

In some specific examples, a method for forming the second insulating layers 111 includes, but is not limited to PVD, CVD, ALD.

Figure 10:
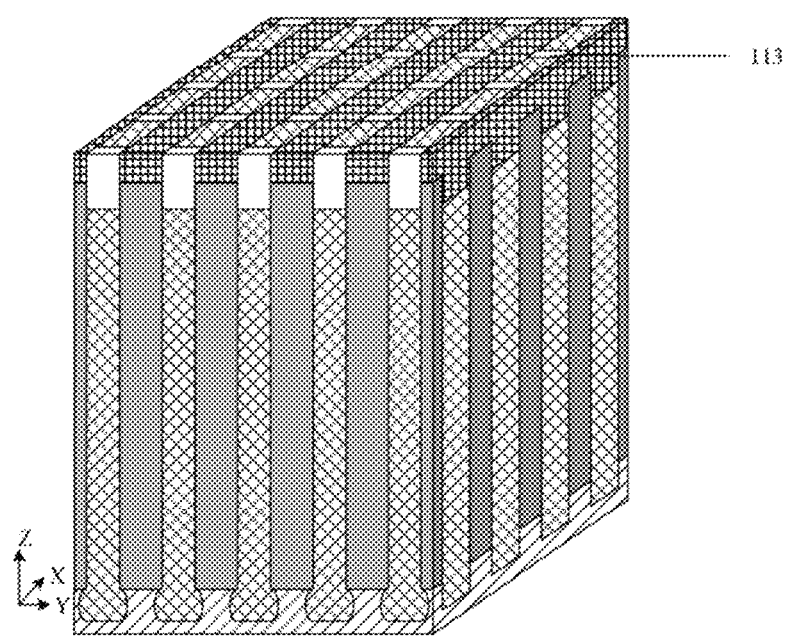

As shown in FIG. 10, parts of the second insulating layers 111 are removed to form multiple second grooves 113 arranged in an array along the first direction and the second direction. Bottom surfaces of the second grooves 113 are flush with the bottom surfaces of the first grooves 112.

In some specific examples, a method for removing parts of the second insulating layers 111 includes but is not limited to a dry etching process and a wet etching process.

Figure 11:
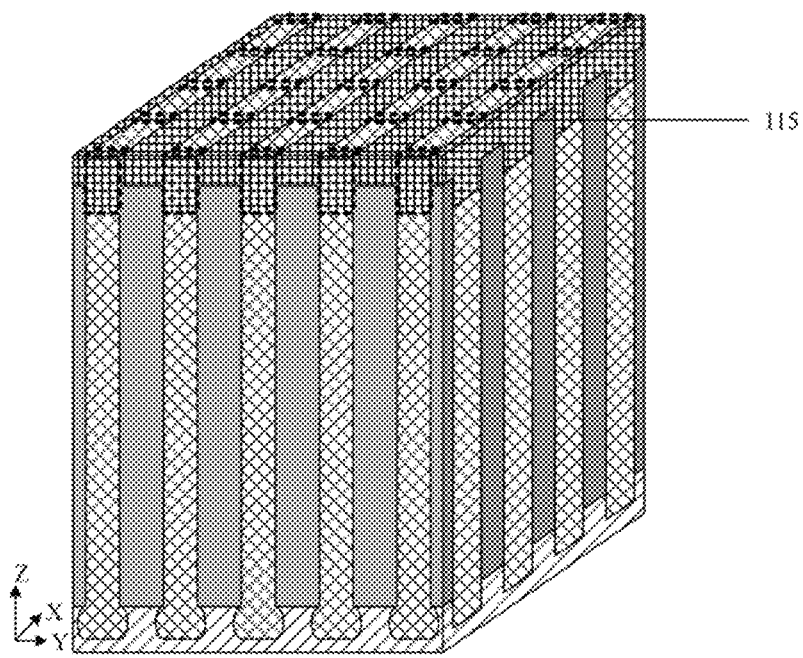
Figure 15:
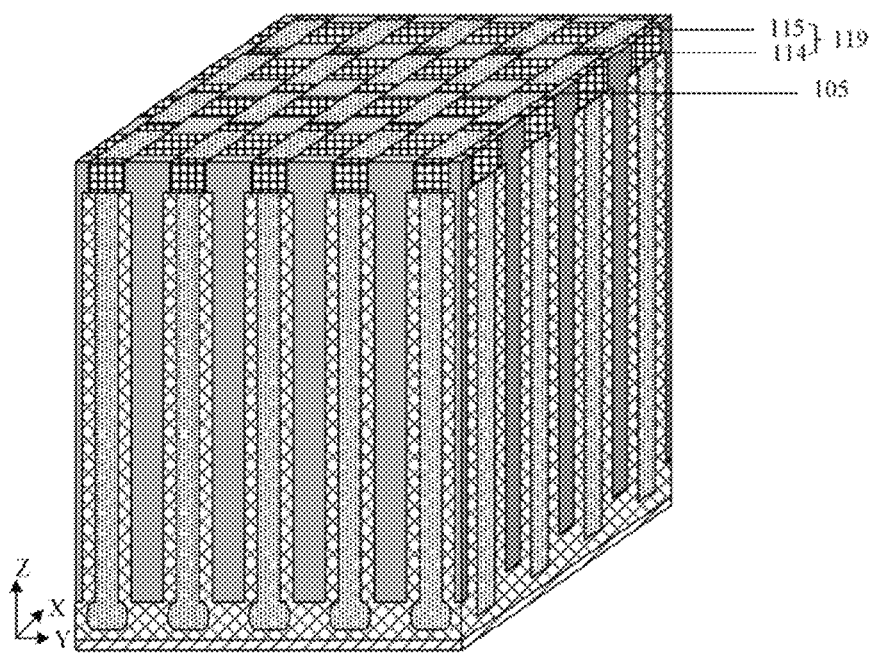

As shown in FIG. 11, the second grooves 113 are filled to form a second supporting material layer 115 (specifically, portions as shown in dashed line frames in FIG. 11), and the first supporting material layer 114 and the second supporting material layer 115 forma top supporting layer 119 (as shown in FIG. 15).

Materials of the first supporting material layer 114 and the second supporting material layer 115 may be the same or different.

In some specific examples, a method for forming the second supporting material layer 115 includes, but is not limited to PVD, CVD, ALD.

In some specific examples, after filling the material of the second supporting material layer 115, performing a planarization treatment on the second supporting material layer 115 is further included, to make the second supporting material layer 115 be flush with top surfaces of the second insulating layers 111.

In some specific examples, the planarization process includes CMP.

It is to be understood that, the top supporting layer 119 can support the first semiconductor pillars 105 and mitigate the problem that the first semiconductor pillars 105 are prone to collapse in a subsequent process.

In some embodiments, after the top supporting layer is formed, the method further includes the following operations.

The remaining first insulating layers and the remaining second insulating layers are removed to form a first filling region. The first filling region exposes parts of sidewalls of the first semiconductor pillars to form the first oxide layers, the second oxide layer and the oxide pillars by an oxidation treatment.

After the oxidation treatment is completed, the first filling region is filled with a sacrificial material, and top surfaces of the first semiconductor pillars are exposed by removing part of the top supporting layer and part of the sacrificial material.

Figure 12:
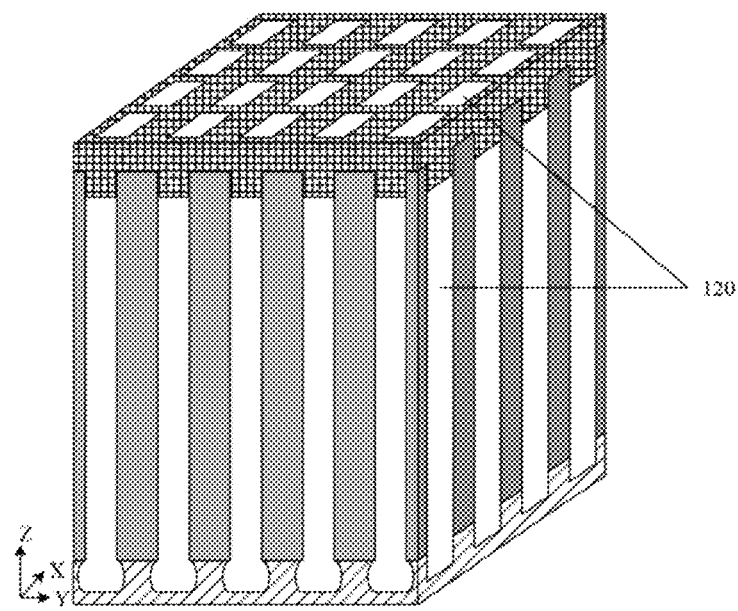

As shown in FIG. 12, the remaining first insulating layers 110 and the remaining second insulating layers 111 are removed to form the first filling region 120. The first filling region 120 exposes parts of the sidewalls of the first semiconductor pillars 105.

In some specific examples, a method for removing the remaining first insulating layers 110 and the remaining second insulating layers 111 includes but is not limited to a dry etching process and a wet etching process.

Figure 13:
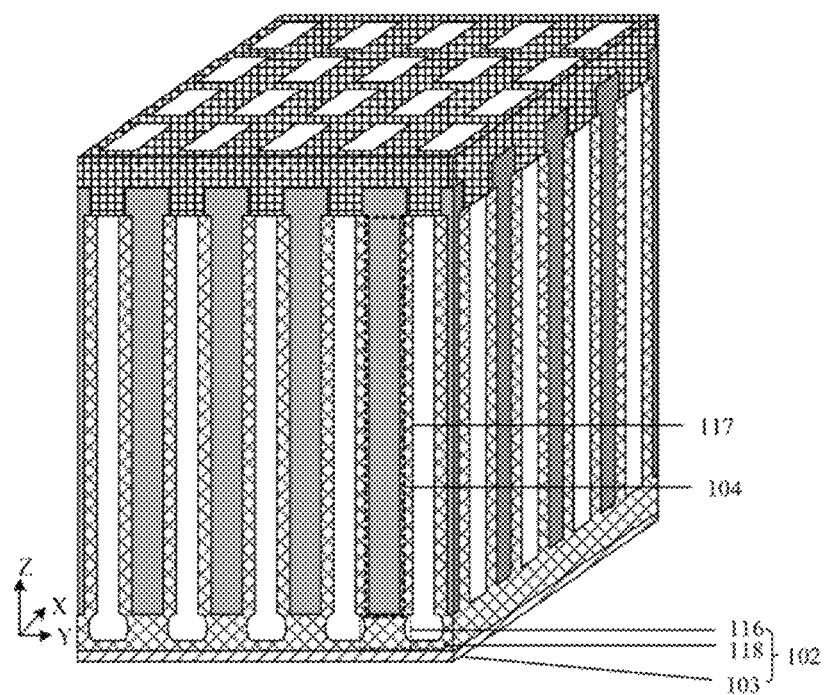

As shown in FIG. 13, the exposed surfaces of the first semiconductor pillars 105 are oxidized by an oxidation process, such as a thermal oxidation process, so that the first portions 105-1 of the first semiconductor pillars 105 are all oxidized into oxide pillars 116, the surfaces of the exposed second portions 105-2 of the first semiconductor pillars 105 are oxidized into first oxide layers 117, and the surface of the substrate 101 is also oxidized into a second oxide layer 118. The doped semiconductor layer 103, the oxide pillars 116, and the second oxide layer 118 together constitute an isolation structure 102. Since the tops of the first semiconductor pillars 105 are covered by the first supporting material layer 114 and the second supporting material layer 115, the tops of the first semiconductor pillars 105 are not oxidized. Part of each of the first semiconductor pillars 105 covered by the first oxide layer 117 constitutes a first active pillar 104.

It is to be understood that, the oxide pillars 116 and the second oxide layer 118 enable capacitors formed in subsequent processes to be isolated from the doped semiconductor layer 103 at the bottom, thereby further mitigating the leakage problem at the bottoms of the capacitors.

Materials of the first oxide layers 117 the second oxide layer 118 and the oxide pillars 116 are the same. For example, the constituent material of the first oxide layers 117, the second oxide layer 118 and the oxide pillars 116 includes but are not limited to silicon oxide.

In some specific examples, the material of the first oxide layers 117, the material of the second oxide layer 118 and the material of the oxide pillars 116 are the same as or different from the material of the first insulating layers 110. The material of the first oxide layer 117, the material of the second oxide layer 118 and the material of the oxide pillar 116 are the same as or different from the material of the second insulating layers 111.

It is to be noted that, after the first trenches 108 and/or the second trenches 109 are subjected to the enlargement process in the aforementioned embodiment, the first portions 105-1 of the first semiconductor pillars 105 are small in size and are easy to be completely oxidized. When the first portions 105-1 of the first semiconductor pillars 105 are oxidized, only the surfaces of the second parts 105-2 of the first semiconductor pillars 105 are oxidized.

Figure 14:
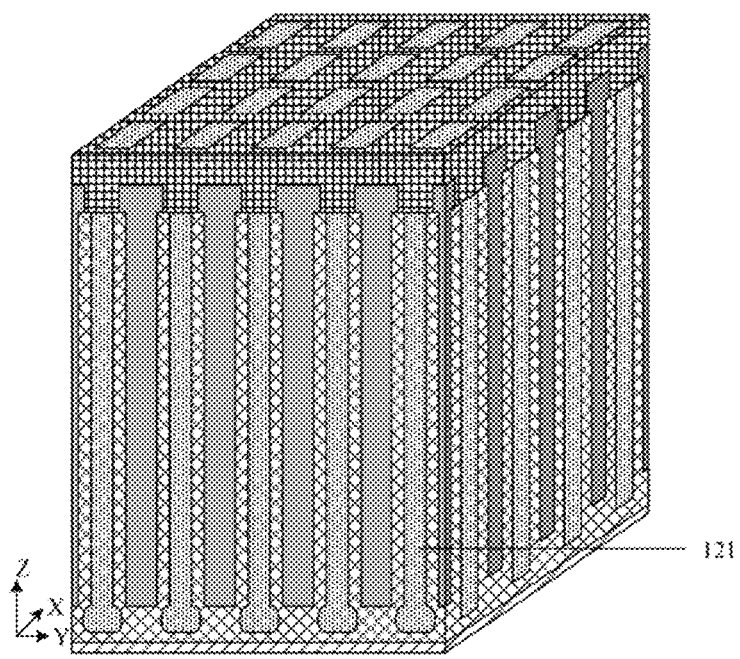

As shown in FIG. 14, the first filling region 120 is filled up with a sacrificial material 121.

In some specific examples, a method for filling the sacrificial material 121 includes, but is not limited to PVD, CVD, ALD.

In some specific examples, a material of the formed sacrificial material 121 includes, but is not limited to polysilicon and carbon.

For the selection of the sacrificial material 121, in a first aspect, it is necessary to consider that the sacrificial material 121 has a certain etching selectivity ratio with respect to the first oxide layer 117, so that the sacrificial material 121 can be retained when the first oxide layer 117 is removed in a subsequent process; in a second aspect, it is necessary to consider that the sacrificial material 121 has a certain etching selectivity ratio with respect to the material of the first electrode layers 106-1 formed in the subsequent process, so that the influence on the formed first electrode layers 106-1 is reduced when the sacrificial material 121 is removed to form the sacrificial layer in the subsequent process; in a third aspect, the sacrificial material 121 needs to be more easily removed in the subsequent process.

As shown in FIG. 15, part of the top supporting layer 119 and part of the sacrificial material 121 are removed to expose the top surfaces of the first semiconductor pillars 105.

In some specific examples, a method for removing the part of the top supporting layer 119 and the part of the sacrificial material 121 includes but are not limited to CMP.

As can be seen from FIG. 15, the first supporting material layer 114 and the second supporting material layer 115 both cover parts of the sidewalls of the first semiconductor pillars 105, the second supporting material layer 115 covers parts of the sidewalls perpendicular to the second direction among the sidewalls of the tops of the first semiconductor pillars 105, and the first supporting layer covers all of the sidewalls perpendicular to the first direction among the sidewalls of the tops of the first semiconductor pillars 105. The top supporting layer 119 composed of the first supporting material layer 114 and the second supporting material layer 115 forms a network structure, which supports the first semiconductor pillars 105 and mitigates the problem that the first semiconductor pillars 105 are prone to collapse.

In S200, a memory structure 106 surrounding sidewalls of first active pillars 104 is mainly formed.

In some embodiments, forming the memory structure surrounding sidewalls of the first active pillars includes the following operations.

The top supporting layer is removed, to expose parts of the first grooves and the second grooves.

The first oxide layers are removed to form second filling regions.

A first conductive material is formed in the first grooves, the second grooves and the second filling regions, in which the first conductive material in the second filling regions forms first electrode layers; removing all the sacrificial material, a third filling region is formed, a dielectric layer is formed in the third filling region, and a second conductive material is deposited on a surface of the dielectric layer to form a second electrode layer.

Figure 16:
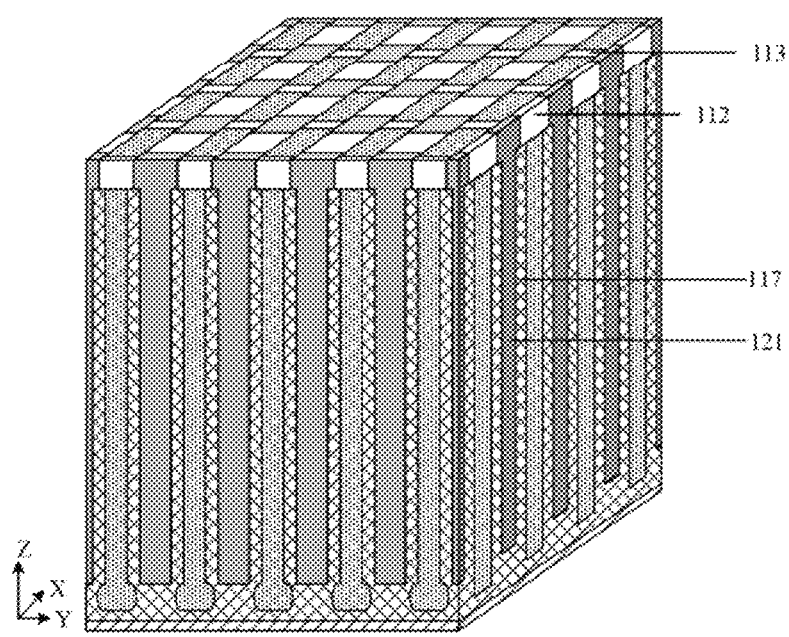

As shown in FIGS. 15 and 16, the top supporting layer 119 is removed and part of the first grooves 112 and the second grooves 113 are exposed.

In some specific examples, a method for removing the top supporting layer 119 includes but is not limited to a dry etching process and a wet etching process.

After the top supporting layer 119 is removed, since the sacrificial material 121 covers part of the sidewalls of the tops of the first semiconductor pillars 105, the sacrificial material 121 between the tops of the first semiconductor pillar 105 can support the first semiconductor pillars 105 when the first oxide layers 117 are removed in a subsequent process, and the collapse problem of the first semiconductor pillars 105 can be mitigated.

Figure 17:
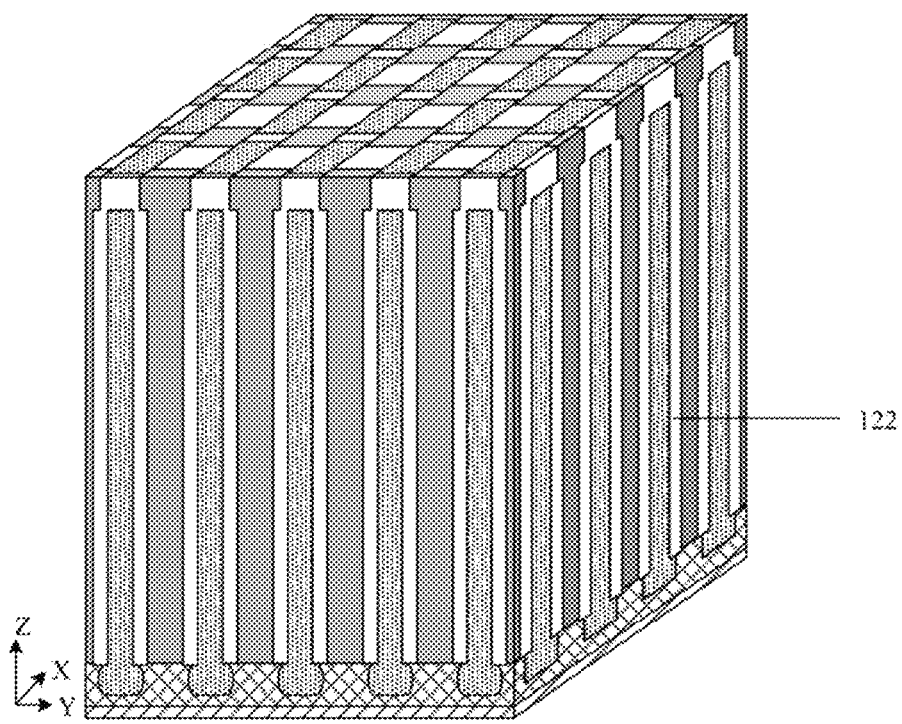

As shown in FIGS. 16 and 17, the first oxide layers 117 are removed to form the second filling regions 122.

In some specific examples, a method for removing the first oxide layers 117 includes but is not limited to a dry etching process and a wet etching process.

Figure 18:
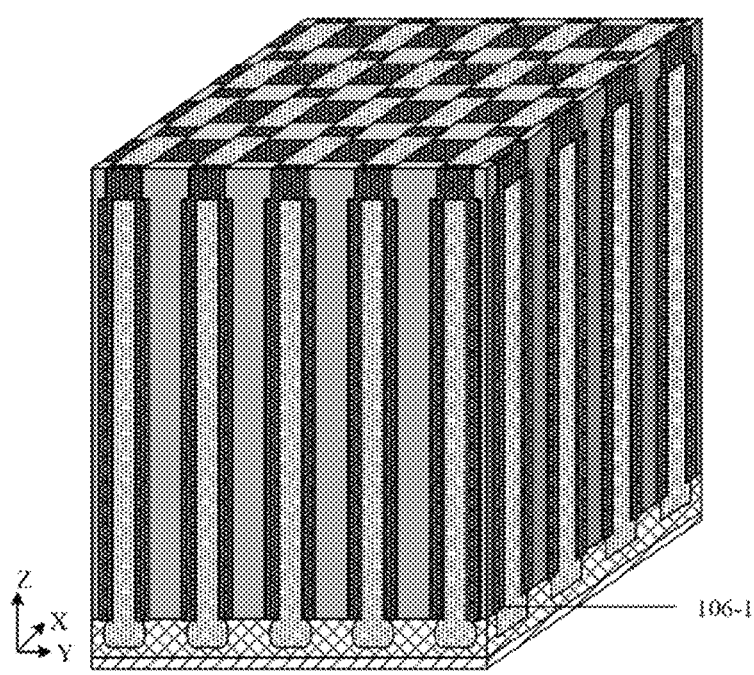

As shown in FIG. 18, the first conductive material is filled in the first grooves 112, the second grooves 113, and the second filling regions 122. The first conductive material located in the second filling regions 122 forms the first electrode layers 106-1.

It is to be understood that, the first conductive material filled in the first grooves 112 and the second grooves 113 are connected to the sidewalls of the tops of the first semiconductor pillar 105, so that the first conductive material filled in the first grooves 112 and the second grooves 113 supports the first semiconductor pillars 105, and the problem that the first semiconductor pillars 105 are prone to collapse when all the sacrificial materials 121 are removed in a subsequent process is mitigated.

The first electrode layers 106-1 serve as lower electrodes of the capacitors.

In some specific examples, the constituent material of the first electrode layers 106-1 may include, but is not limited to ruthenium (Ru), ruthenium oxide (RuO), titanium nitride (TiN).

In some specific examples, a method for forming the first electrode layers 106-1 includes, but is not limited to PVD, CVD, ALD.

It is to be understood that, in an embodiment of the present disclosure, the second filling regions 122 are formed after the first oxide layers 117 are removed. At this time, the second filling regions 122 surround the first active pillars 104, and a material for forming the first electrode layers 106-1 is directly filled in the second filling regions 122, thereby forming the first electrode layers 106-1, and the multiple formed first electrode layers 106-1 are separated from each other. In conventional methods, the material of the first electrode layers 106-1 is directly deposited in the first trenches 108 and the second trenches 109 in the gaps between the first semiconductor pillars 105 to form multiple first electrode layers 106-1, such that the bottoms of the multiple first electrode layers 106-1 cannot be separated from each other and thus the first electrode layers 106-1 interfere with each other. The first electrode layers 106-1 formed by the solution of the embodiment of the present disclosure can be separated from each other, so that the problem of mutual interference among the multiple first electrode layers 106-1 can be mitigated.

Figure 19:
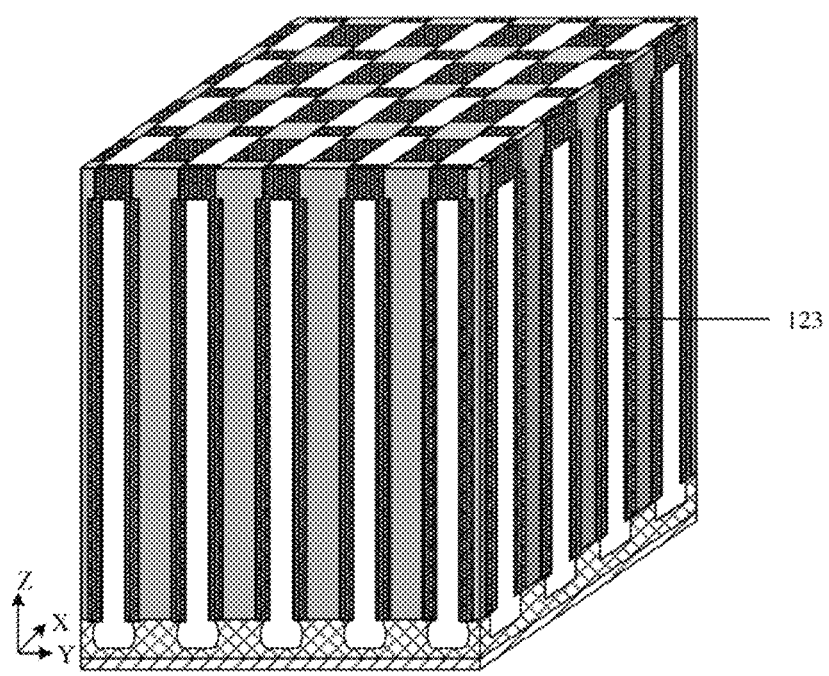

As shown in FIG. 19, all of the sacrificial material 121 is removed to form a third filling region 123.

In some specific examples, a method for removing the sacrificial material 121 includes but is not limited to a dry etching process and a wet etching process.

Figure 20:
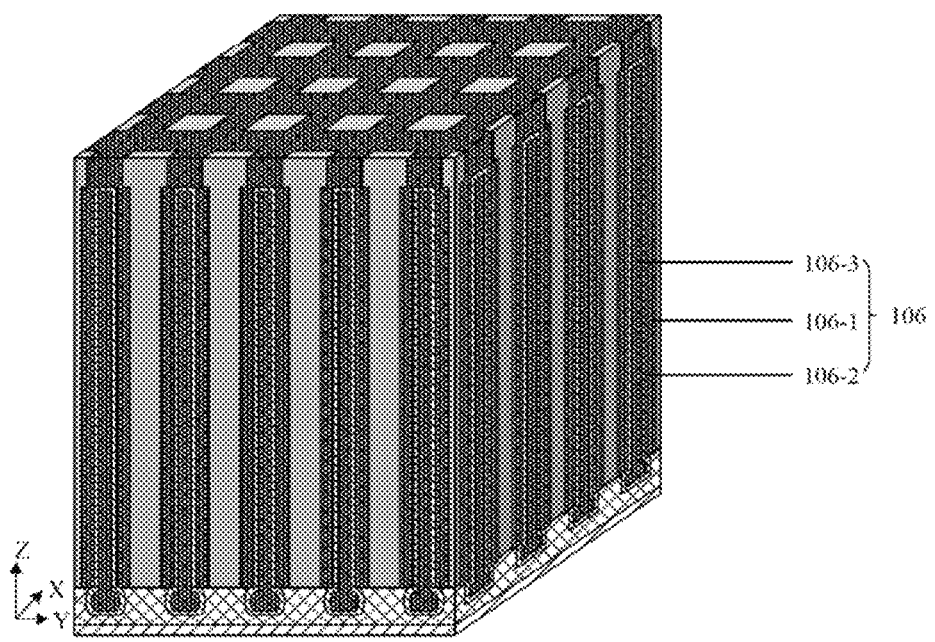

As shown in FIG. 20, a dielectric layer 106-2 is formed in the third filling region 123 and a second conductive material is deposited on a surface of the dielectric layer 106-2 to form a second electrode layer 106-3. The dielectric layer 106-2 and the second electrode layer 106-3 formed are embedded in the isolation structure 102, and the dielectric layer 106-2, the first electrode layers 1M-1, and the second electrode layer 106-2 together constitute the memory structure 106.

It is to be noted that, only the case that the dielectric layer 106-2 is formed in the gaps between the first active pillars 104 is shown in FIG. 20. In some specific examples, when the dielectric layer 106-2 is formed between the first active pillars 104, the dielectric layer 106-2 is also formed in the gaps between the tops of the first semiconductor pillars 105.

The dielectric layers 106-2 serve as dielectrics of the capacitors.

A constituent material of the dielectric layers 106-2 includes a high dielectric constant (High-K) material, which generally refers to a material with a dielectric constant higher than 3.9 and generally significantly higher than this value. In some specific examples, the material of the dielectric layer 106-2 may include, but is not limited to alumina ($Al_2O_3$), zirconia (ZrO), hafnium oxide ($HfO_2$), strontium titanate ($SrTiO_3$), and the like.

In some specific embodiments, a constituent material of the second electrode layer 106-3 may include, but is not limited to ruthenium, ruthenium oxide, titanium nitride.

In some specific examples, a method for forming the second electrode layer 106-3 includes, but is not limited to processes such as PVD CVD and the like.

It is to be understood that the dielectric layer 106-2 and the second electrode layer 106-3 are embedded in the isolation structure 102, so that the leakage problem of the capacitors can be improved.

In S300, as shown in FIGS. 21 to 29, mainly multiple second active pillars 107 are formed.

In some embodiments, forming the multiple second active pillars includes the following operations.

The first conductive material and the second conductive material around a sidewall a top of each of the first active pillars are removed.

A first semiconductor substrate is formed by epitaxial growth on the tops of the first semiconductor pillars.

Multiple third trenches arranged at intervals along the first direction are formed in the first semiconductor substrate.

A third insulating layer is formed in each of the third trenches.

A first mask layer is formed on the first semiconductor substrate, and multiple fourth trenches arranged at intervals along the second direction are formed through the first mask layer; in which the third trenches and the fourth trenches divide the first semiconductor substrate into the multiple second semiconductor pillars;

A fourth insulating layer is formed in each of the fourth trenches.

Part of each of the third insulating layers and part of each of the fourth insulating layers are removed to expose part of a sidewall of each of the second semiconductor pillars.

An oxidation treatment is performed on the exposed sidewalls of the second semiconductor pillars, to oxidize the exposed sidewalls to form third oxide layers.

The third oxide layers are removed, in which the exposed second semiconductor pillars form the second active pillars.

Figure 21:
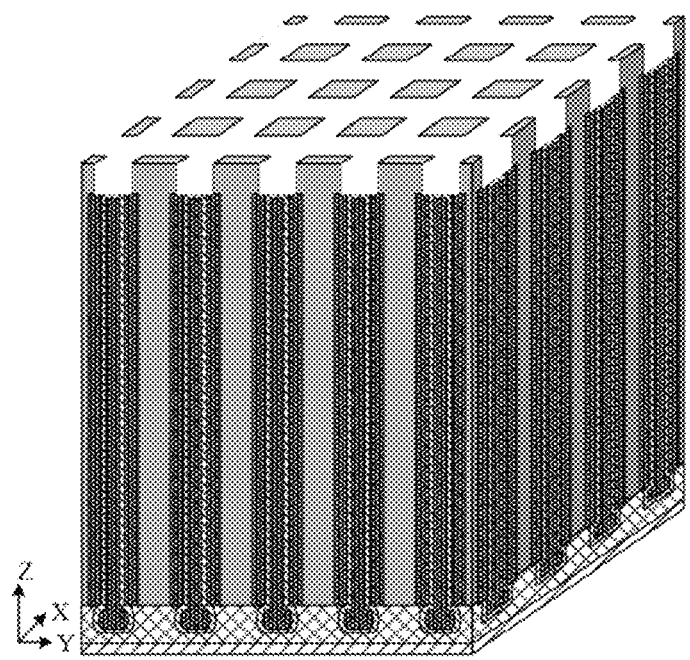

The formation process of the second active pillars is described in detail below with reference to FIGS. 21 to 29. As shown in FIG. 21, the first conductive material, the second conductive material and the dielectric layer 106-2 located around the sidewalls of the tops of the first semiconductor pillars 105 are removed.

In some specific examples, a method for removing the first conductive material, the second conductive material and the dielectric layer 106-2 located around the sidewalls of the tops of the first semiconductor pillars 105 includes, but is not limited to a dry etching process and a wet etching process.

Figure 22:
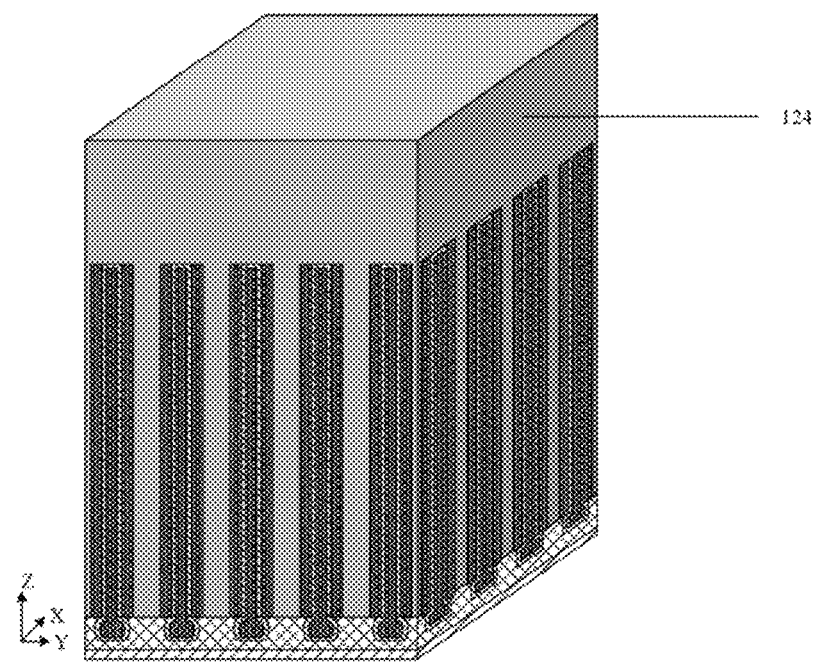

As shown in FIG. 22, the first semiconductor substrate 124 is formed on the tops of the first semiconductor pillars 105 by an epitaxial growth process.

In some specific examples, a method for forming the first semiconductor substrate 124 includes, but is not limited to the epitaxial growth process.

It is to be understood that, in the above-mentioned embodiment, the first conductive material, the second conductive material, and the dielectric layer 106-2 around the sidewalls of the tops of the first semiconductor pillars 105 are removed to expose part of the sidewalls of the tops of the first semiconductor pillars 105, mainly for a purpose of enabling the first semiconductor substrate 124 to be formed more conveniently by the epitaxial growth.

In some specific examples, a material of the first semiconductor substrate 124 may include an elemental semiconductor material (for example, silicon, germanium and the like), a composite semiconductor material (for example, germanium silicon and the like) and the like.

Figure 23:
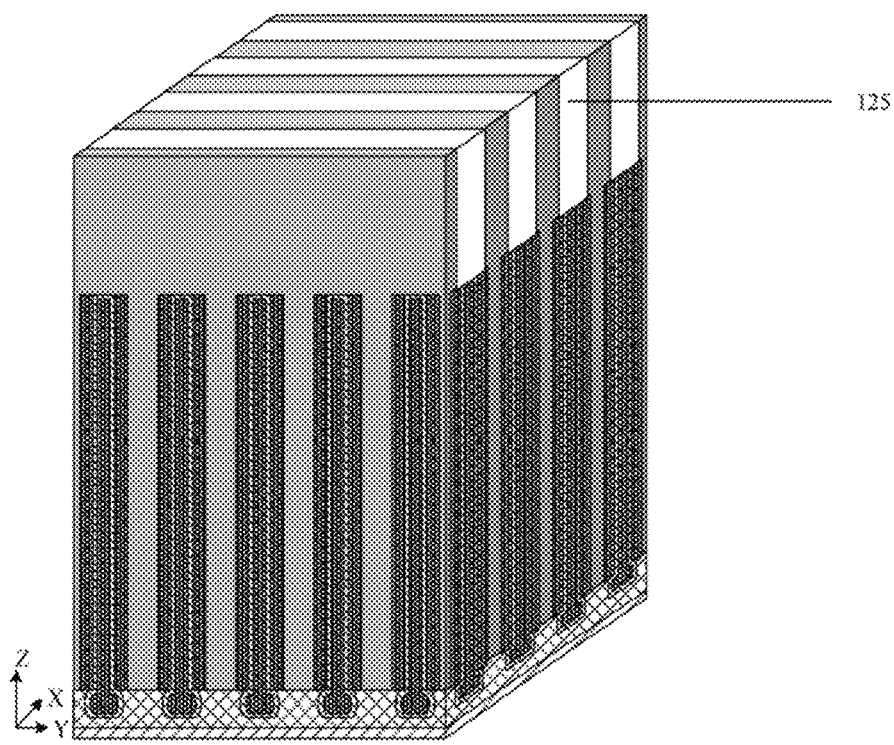

As shown in FIG. 23, multiple third trenches 125 arranged at intervals along the first direction are formed in the first semiconductor substrate 124.

In some specific examples, a method for forming third trenches includes but is not limited to a dry etching process and a wet etching process.

Figure 24:
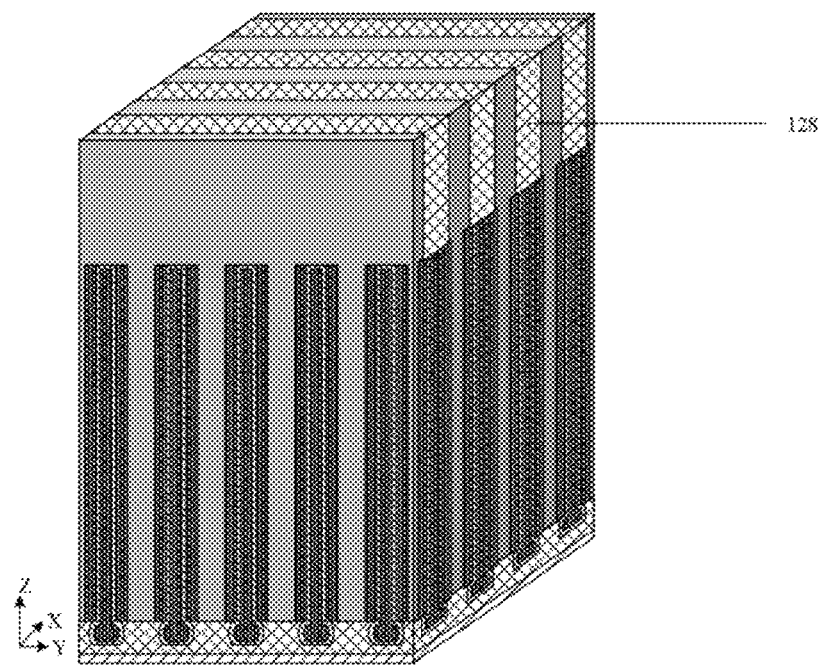

As shown in FIG. 24, a third insulating layer 128 is formed in each of the third trenches 125.

In some specific examples, a material of the third insulating layers 128 includes but is not limited to silicon oxide.

In some specific examples, a method for forming the third insulating layers 128 includes, but is not limited to PVD, CVD, ALD.

Figure 25:
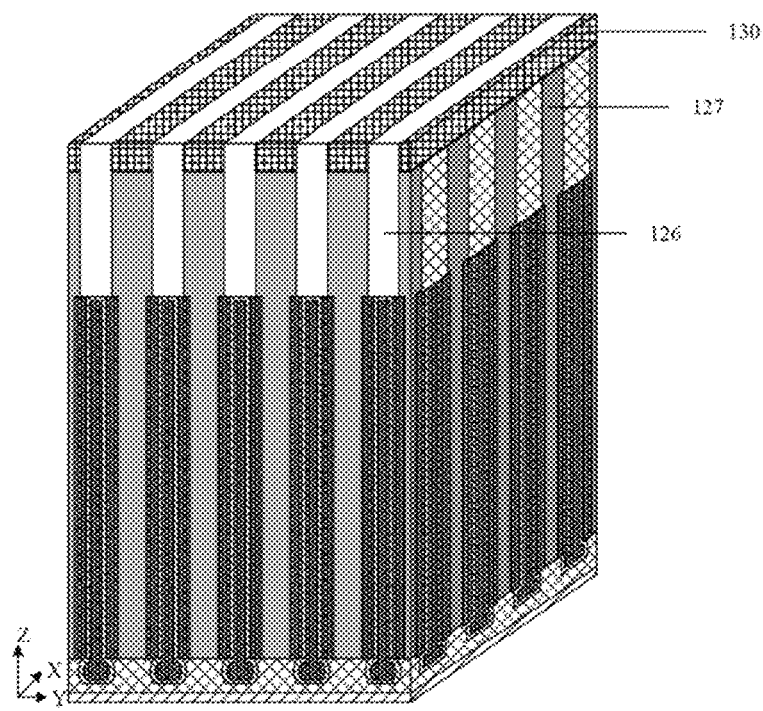

As shown in FIG. 25, a first mask layer 130 is formed on the first semiconductor substrate 124. Multiple fourth trenches 126 arranged at intervals in the second direction are formed through the first mask layer 130. The third trenches 125 and the fourth trenches 126 divide the first semiconductor substrate 124 into multiple second semiconductor pillars 127. A projection of the formed second semiconductor pillars 127 coincides with a projection of the first semiconductor pillars 105 on the first plane.

In some specific examples, a material of the first mask layer 130 includes, but is not limited to silicon nitride.

In some specific examples, a method for forming the first mask layer 130 includes, but is not limited to PVD, CVD, ALD.

Figure 26:
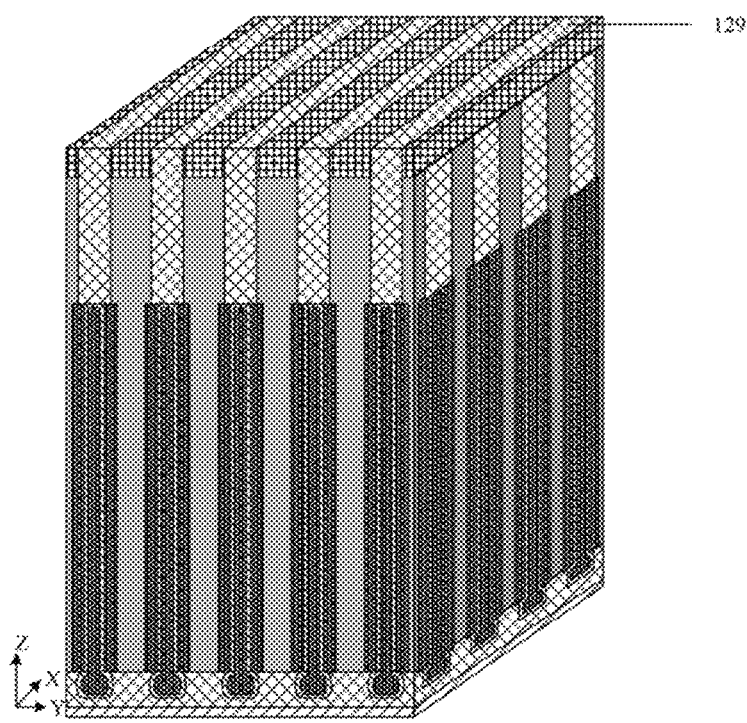

As shown in FIG. 26, a fourth insulating layer 129 is formed in each of the fourth trenches 126.

In some specific examples, a material of the fourth insulating layers 129 includes but is not limited to silicon oxide.

In some specific examples, a method for forming the fourth insulating layers 129 includes, but is not limited to PVD, CVD, ALD.

Figure 27:
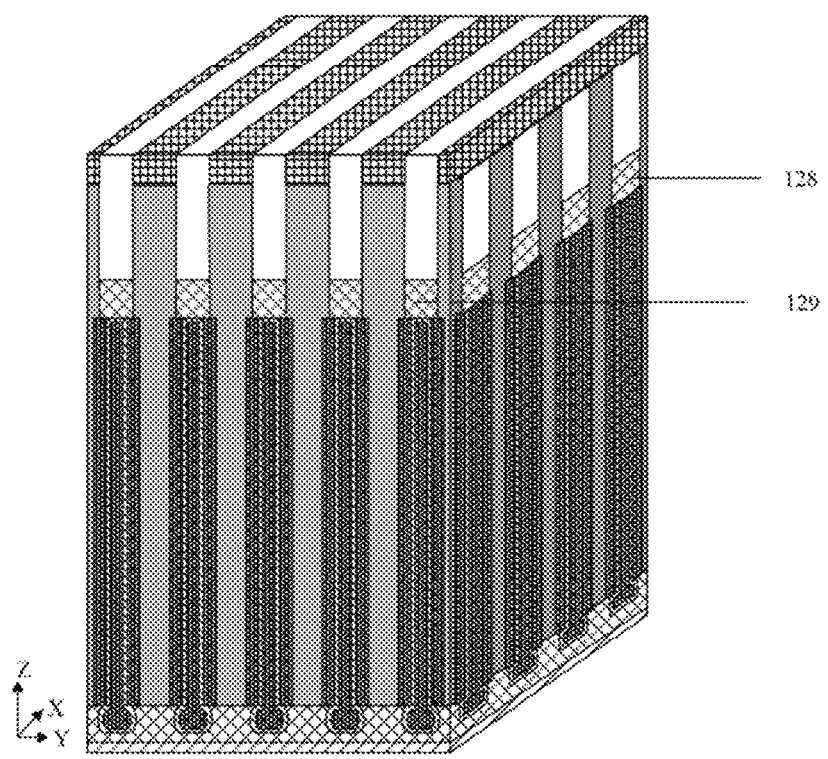

As shown in FIG. 27, parts of the third insulating layers 128 and parts of the fourth insulating layers 129 are removed, so that parts of the sidewalls of the second semiconductor pillars 127 are exposed.

In some specific examples, a method for removing parts of the third insulating layers 128 and parts of the fourth insulating layers 129 includes but is not limited to a dry etching process and a wet etching process.

Figure 28:
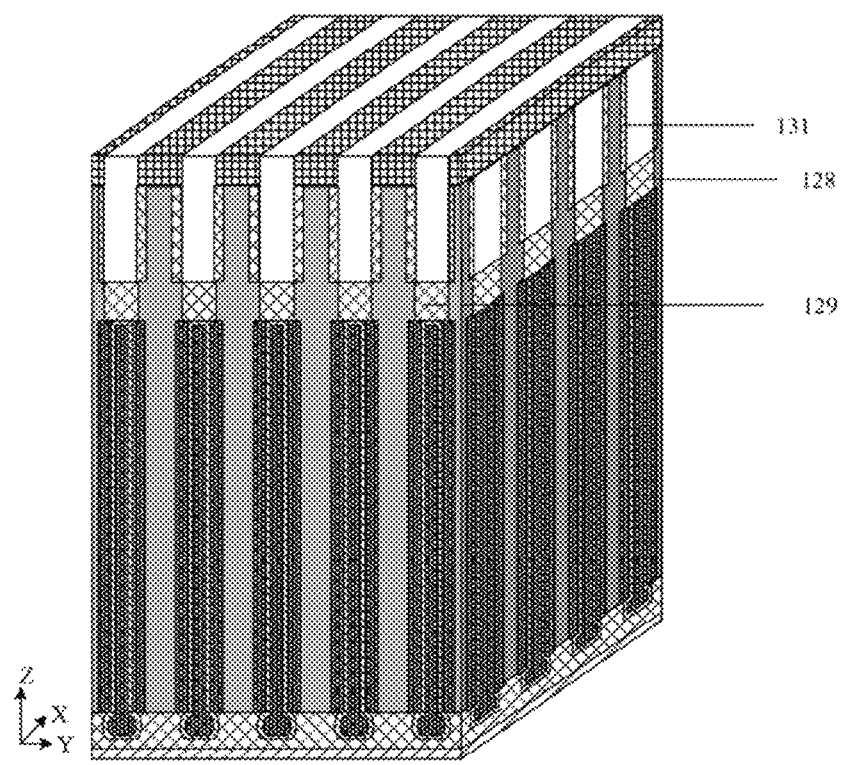

As shown in FIG. 28, an oxidation treatment is performed on the exposed sidewalls of the second semiconductor pillars, to oxidize the exposed sidewalls into third oxide layers 131.

In some specific examples, a material of the third oxide layers 131 includes, but is not limited to silicon oxide.

Figure 29:
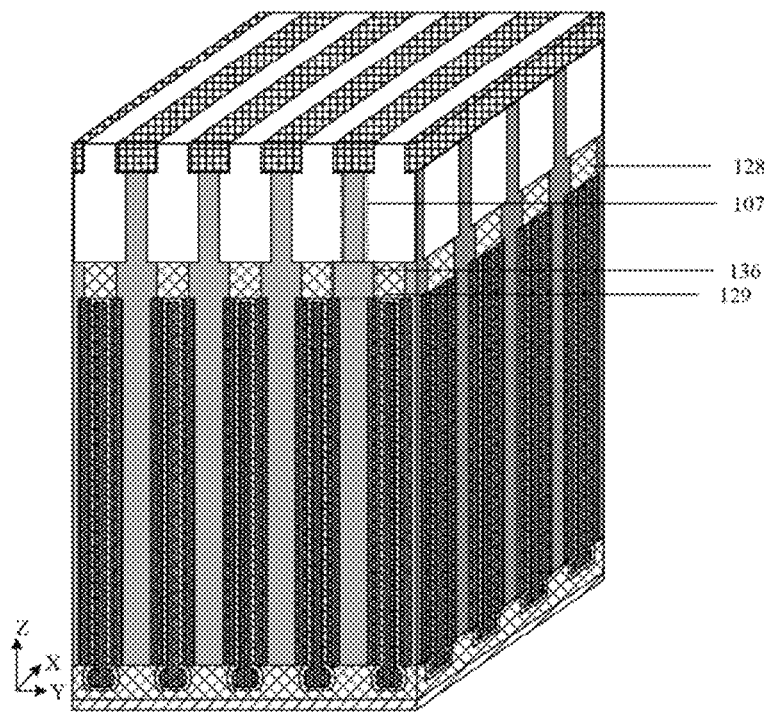
Figure 30:
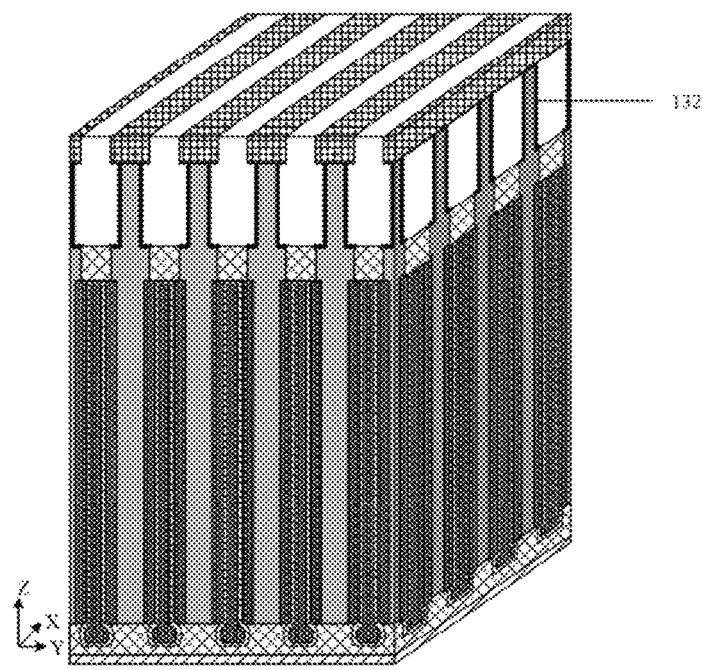

As shown in FIG. 29, the third oxide layers 131 are removed and parts of the second semiconductor pillars 127 whose sidewalls are exposed form second active pillars 107. Parts of the semiconductor pillars between the first active pillars 104 and the second active pillars 107 constitute connecting pillars 136. A radial width of the connecting pillars 136 is larger than radial widths of the first active pillars 104 and the second active pillars 107.

In S400, multiple transistors are formed mainly.

In some embodiments, forming the multiple transistors includes the following operations.

Gate oxide layers are formed on parts of the sidewalls of the second active pillars.

A third conductive material is filled in gaps between the second active pillars having the gate oxide layers.

Part of the third conductive material is removed through the first mask layer to form gates.

A source and a drain are formed respectively at opposite ends of each of the second active pillars.

The formation process of the transistors is described in detail below with reference to FIGS. 30 to 33.

A gate oxide layer is formed on part of the sidewall of each of the second active pillars.

The gate oxide layer is located between the gate 133 and a channel region, such that the channel region and the gate 133 are electrically isolated, and hot carrier effect of the transistors is reduced.

In some specific examples, a method for forming the gate oxide layers 132 includes, but is not limited to a thermal oxidation.

In some specific examples, a material of the gate oxide layers 132 includes, but is not limited to silicon oxide.

Figure 31:
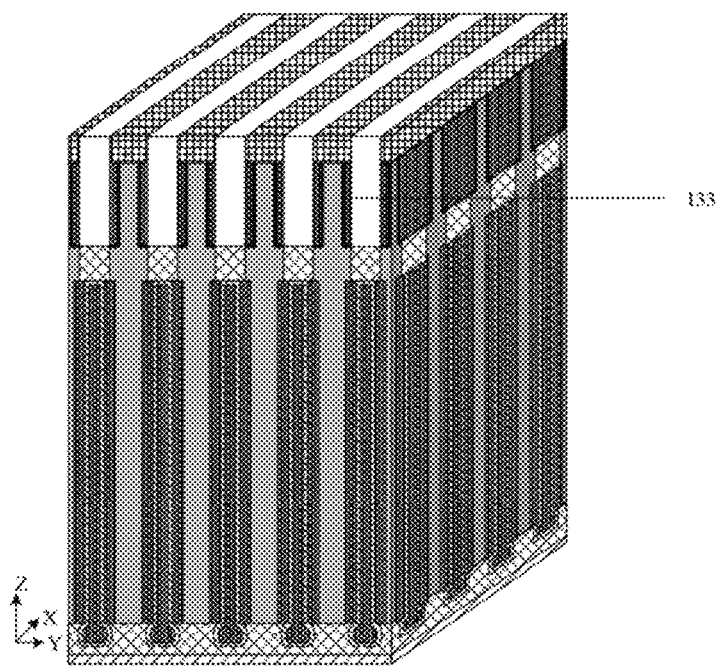

As shown in FIG. 31, a third conductive material is filled in gaps between the second active pillars 107 having the gate oxide layers 132. Part of the third conductive material is removed by the first mask layer 130 to form the gates 133.

It is to be understood that, in the aforementioned embodiment, after the fourth trenches 126 are formed by the first mask layer 130, the first mask layer 130 is not removed, and the first mask layer 130 is still used as a mask when the part of the third conductive material is removed, so that process operations can be simplified, process time can be saved, and process materials can be saved at the same time.

In some specific examples, the third conductive material may include metal or polysilicon (Poly) or the like.

In some specific examples, a method for forming the third conductive layer includes, but is not limited to PVD, CVD, ALD and the like.

Among different types of transistors, gates 133 have different shapes. For example, in the pillar gate transistor, the gate 133 is formed in the pillar form on one side of the channel region. In the gate half around transistor, the gate 133 half surrounds the channel region. In the gate all around (GAA) transistor, the gate 133 completely surrounds the channel region.

The transistor type in the embodiment of the present disclosure may include the above-mentioned various types, but are not limited thereto. Preferably, the type of the transistor is a GAA transistor.

A source and a drain are formed respectively at opposite ends of each of the second active pillars 107. A method for forming sources and drains includes, but is not limited to a doping process and a diffusion process.

It is to be noted that, positions of the source and the drain at opposite ends of each of the second active pillars 107 are interchangeable. The actual situation may be selected and set according to the actual needs.

Figure 32:
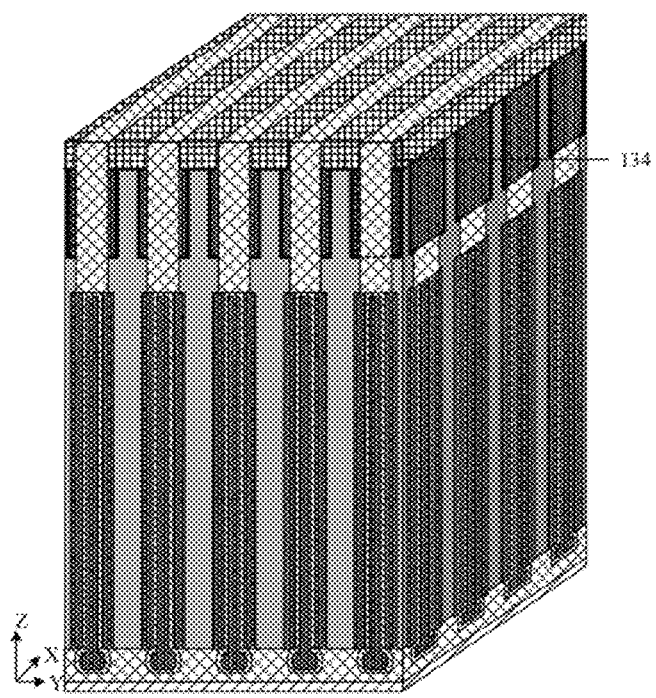

As shown in FIG. 32, fifth insulating layers 134 are formed between the second active pillars 107 (as shown in the dashed box in FIG. 32).

In some specific examples, a material of the fifth insulating layers 134 includes, but is not limited to silicon oxide.

Figure 33:
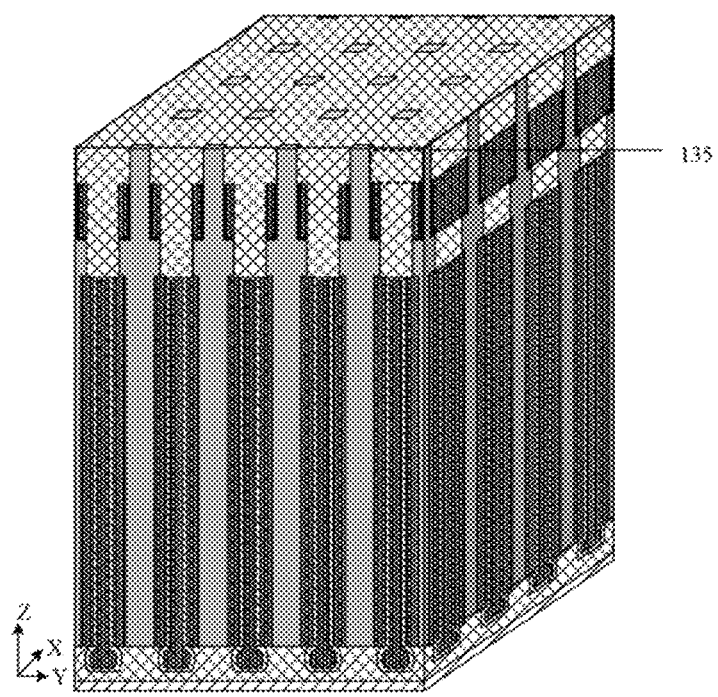

As shown in FIG. 33, the first mask layer 130 is removed and parts of the gates 133 are removed. A sixth insulating layer 135 (as shown in the dashed box in FIG. 33) is filled between the second active pillars 107.

In some specific examples, a material of the sixth insulating layer 135 includes, but is not limited to silicon oxide.

In some embodiments, the method further includes the following operation.

Multiple bit lines are formed on the second active pillars 107. The multiple bit lines are in electrical contact with tops of the second active pillars.

It is to be understood that, the memory in the above embodiment is of a TOC (Transistor on Capacitor) structure, and the structure further includes multiple bit lines located on the transistors and in electrical contact with the tops of the second active pillars 107.

It is to be understood that, the bit line BL is used to perform a read or write operation on a transistor when the transistor is turned on.

The bit lines BL are arranged above the transistors, and the bit lines BL are used as metal bit lines (Metal BL), which can reduce the resistance and reduce the difficulty of the process difficulty, and it is more compatible with the circuit design scheme of the memory.

It is to be understood that, with the requirements for memory density improving, the aspect ratio of semiconductor pillars continues to increases, it is easy to collapse when high semiconductor pillars are formed at one time to form the memory structure 106 and transistors. In the embodiments of this disclosure, firstly the first semiconductor pillars 105 are formed, the memory structure 106 is formed between the first semiconductor pillars 105, the second semiconductor pillars 127 are formed above the first semiconductor pillars 105, and the transistors are formed between the second semiconductor pillars 127. That is to say, in the embodiments of this disclosure, the semiconductor pillars are formed in two phases, and the top supporting layer 119 is formed on the tops of the first semiconductor pillars 105, so that the collapse problem can be effectively mitigated.

The embodiments of the disclosure provide a method for manufacturing a semiconductor structure, and the method includes the following operations. A substrate 101 is provided, an isolation structure 102 is formed on the substrate 101, and multiple first active pillars 104 arranged in an array along a first direction and a second direction are formed on the isolation structure. The first direction and the second direction are both perpendicular to an extension direction of the first active pillars 104, and the first direction and the second direction intersect. A memory structure 106 surrounding sidewalls of the first active pillars 104 is formed. The memory structure 106 includes first electrode layers 106-1, a dielectric layer 100-2 and a second electrode layer 106-3. The first electrode layers 106-1 cover sidewalls of the first active pillars 104, the dielectric layer 100-2 covers at least surfaces of the first electrode layers 106-1, the second electrode layer 106-3 covers a surface of the dielectric layer 106-2, and bottoms of the dielectric layer 106-2 and the second electrode layer 106-3 are embedded in the isolation structure. Multiple second active pillars 107 are formed.

Each of the second active pillars 107 is located above one corresponding first active pillar 104. Multiple transistors are formed, a channel structure of each of the transistors is located in each of the second active pillars 107, and an extension direction of the channel structure is the same as the extension direction of the second active pillar 107. In the embodiments of the present disclosure, on the one hand, the isolation structure 102 is formed on the substrate 101 and the bottoms of the formed memory structures 106 are embedded in the isolation structure 102, so that the leakage problem of the memory structures 106 can be mitigated. On the other hand, the first active pillars 104 are formed and memory structures 106 surrounding the first active pillars 104 are formed. Then the second active pillars 107 are formed above the first active pillars 104 and the transistors are formed in the gaps between the second active pillars. By doing so, the problem of easy collapse caused by forming higher active pillars at one time can be mitigated.

In another aspect, the embodiments of the disclosure provide a semiconductor structure.

The semiconductor structure includes a substrate, multiple first active pillars located above the substrate, a memory structure, multiple transistors, and multiple second active pillars.

The multiple first active pillars are arranged in an array along a first direction and a second direction. The first direction and the second direction are both perpendicular to an extension direction of the first active pillars, and the first direction and the second direction intersect; the substrate includes an isolation structure on which the multiple first active pillars are located.

The memory structure includes first electrode layers, a dielectric layer and a second electrode layer. The first electrode layers covers sidewalls of the first active pillars, the dielectric layer covers at least surfaces of the first electrode layers, the second electrode layer covers a surface of the dielectric layer, and bottoms of the dielectric layer and the second electrode layer are embedded in the isolation structure.

Each of the second active pillars is located above a corresponding one of the first active pillars; a channel structure of each of transistors is located in each of the second active pillars, and an extension direction of the channel structure is the same as an extension direction of the second active pillar.

In some embodiments, the isolation structure includes a doped semiconductor layer, a second oxide layer, and multiple oxide pillars. The second oxide layer is located on a surface of the doped semiconductor layer, the multiple oxide pillars are located on the doped semiconductor layer, and each of the first active pillars is located on a top surface of a corresponding one of the oxide pillars; a doping type of the doped semiconductor layer is different from a doping type of the first active pillars.

In some embodiments, the dielectric layer also covers sidewalls of the oxide pillars and bottoms of gaps between the adjacent oxide pillars. The second electrode layer extends into the gaps between the oxide pillars.

In some embodiments, the semiconductor structure further includes multiple connecting pillars, each of the connecting pillars is located between one of the first active pillars and the corresponding one of the second active pillars, and a radial width of the connection pillars is greater than a radial width of the first active pillars and a radial width of the second active pillars.

In some embodiments, each of the transistors includes a gate oxide layer arranged surrounding each the second active pillar, a gate arranged surrounding the gate oxide layer, and a source and a drain respectively arranged at two opposite ends of each of the second active pillars; a side of the gate away from the gate oxide layer is flush with sidewalls of the connecting pillars.

In some embodiments, the semiconductor structure further includes multiple bit lines.

The multiple bit lines are located above the transistors and are in electrical contact with tops of the second active pillars.

According to yet another aspect of the present disclosure, the embodiments of the present disclosure also provide a memory, and the memory includes at least one semiconductor structure as described in any embodiment of the above-mentioned embodiments of the present disclosure.

The semiconductor structure and the memory provided by the above-mentioned embodiments have been described in detail during describing the method and are not repeated here.

Among the several embodiments provided in the disclosure, it should be understood that the disclosed apparatus and methods may be implemented in a non-target manner. The embodiments of the device described above are only schematic. For example, the division of the unit is only a logical function division, and there may be another division mode in actual implementation, for example, multiple units or components can be combined, or integrated into another system, or some features can be ignored or not executed. In addition, the components shown or discussed are coupled with each other, or directly coupled.

The features disclosed in the embodiments of several methods or devices provided by the disclosure can be arbitrarily combined without conflict, to obtain a new embodiment of the method or embodiment of the device.

The above-mentioned is only specific embodiments of the disclosure, but the scope of protection of the disclosure is not limited thereto. Changes or substitutions of which those skilled in the art can easily think within the technical scope of the disclosure should be covered within the scope of protection of the disclosure. Therefore, the scope of protection of the disclosure should be subject to the scope of protection of the claims.

The invention claimed is:

1. A semiconductor structure, comprising a substrate, a plurality of first active pillars above the substrate, a memory structure, a plurality of transistors, and a plurality of second active pillars, wherein,
the plurality of the first active pillars are arranged in an array along a first direction and a second direction, the first direction and the second direction are perpendicular to an extension direction of the first active pillars, and the first direction and the second direction intersect, the substrate comprises an isolation structure on which the plurality of the first active pillars are located;
the memory structure comprises first electrode layers, a dielectric layer and a second electrode layer; the first electrode layers cover sidewalls of the first active pillars, the dielectric layer covers at least surfaces of the first electrode layers, the second electrode layer covers a surface of the dielectric layer, and bottoms of the dielectric layer and the second electrode layer are embedded in the isolation structure; and
each of the second active pillars is located above a corresponding one of the first active pillars, a channel structure of each of the transistors is located in each of the second active pillars, and an extension direction of the channel structure is same as an extension direction of the second active pillars.

2. The semiconductor structure according to claim 1, wherein the isolation structure comprises: a doped semiconductor layer, a second oxide layer, and a plurality of oxide pillars; the second oxide layer is located on a surface of the doped semiconductor layer, the plurality of the oxide pillars are located on the doped semiconductor layer, and each of the first active pillars is located on a top surface of a corresponding one of the oxide pillars, and a doping type of the doped semiconductor layer is different from a doping type of the first active pillars.

3. The semiconductor structure according to claim 2, wherein the dielectric layer also covers sidewalls of the oxide pillars and bottoms of gaps between the adjacent oxide pillars, and the second electrode layer extends into the gaps between the oxide pillars.

4. The semiconductor structure according to claim 1, wherein the semiconductor structure further comprises a plurality of connecting pillars, each of the connecting pillars is located between one of the first active pillars and a corresponding one of the second active pillars, and a radial width of the connection pillars is greater than a radial width of the first active pillars and a radial width of the second active pillars.

5. The semiconductor structure according to claim 4, wherein each of the transistors comprises a gate oxide layer arranged surrounding each of the second active pillars, a gate arranged surrounding the gate oxide layer, and a source and a drain respectively arranged at two opposite ends of each of the second active pillars; a side of the gate away from the gate oxide layer is flush with sidewalls of the connecting pillars.

6. The semiconductor structure according to claim 1, further comprising:
a plurality of bit lines which are located above the transistors and are in electrical contact with tops of the second active pillars.

7. A memory, comprising the semiconductor structure according to claim 1.

8. A method for manufacturing a semiconductor structure, comprising:
providing a substrate, forming an isolation structure on the substrate, and forming a plurality of first active pillars arranged in an array along a first direction and a second direction on the isolation structure, wherein the first direction and the second direction are perpendicular to an extension direction of the first active pillars, and the first direction and the second direction intersect;
forming a memory structure surrounding sidewalls of the first active pillars, wherein the memory structure comprises first electrode layers, a dielectric layer and a second electrode layer, each of the first electrode layers covers a sidewall of each of the first active pillars, the dielectric layer covers at least surfaces of the first electrode layers, the second electrode layer covers a surface of the dielectric layer, and bottoms of the dielectric layer and the second electrode layer are embedded in the isolation structure;
forming a plurality of second active pillars, wherein each of the second active pillars is located above a corresponding one of the first active pillars; and
forming a plurality of transistors, a channel structure of each of the transistors is located in each of the second active pillars, and an extension direction of the channel structure is same as an extension direction of the second active pillars.

9. The method for manufacturing a semiconductor structure according to claim 8, wherein forming the isolation structure on the substrate comprises:
forming a doped semiconductor layer by doping a bottom of the substrate, forming a plurality of first trenches arranged at intervals along the first direction and a plurality of second trenches arranged at intervals along the second direction in the substrate, wherein bottoms of the first trenches and the second trenches are located in the doped semiconductor layer;
enlarging the bottom of each of the first trenches and/or the bottom of each of the second trenches to form a plurality of first semiconductor pillars, wherein each of the first semiconductor pillars comprises a first portion and a second portion located on the first portion, a maximum radial width of the first portion is less than a minimum radial width of the second portion; and
performing an oxidation treatment on the first semiconductor pillars, so that the first portions are completely oxidized into oxide pillars, exposed surfaces of the second portions are oxidized to form first oxide layers, and a surface of the doped semiconductor layer is oxidized to form a second oxide layer, wherein unoxidized part of the doped semiconductor layer, the oxide pillars, and the second oxide layer together constitute the isolation structure.

10. The method for manufacturing a semiconductor structure according to claim 9, wherein a doping type of the doped semiconductor layer is different from a doping type of the first semiconductor pillars.

11. The method for manufacturing a semiconductor structure according to claim 9, further comprising: forming a top supporting layer on the substrate, which comprises:
filling a first insulating layer in each of the first trenches after forming the first trenches;
removing part of each of the first insulating layer to form a first groove, wherein a bottom surface of the first groove is lower than a top surface of the substrate;
forming a first supporting material layer covering the first grooves and a top of the substrate;
forming a plurality of second trenches arranged at intervals along the second direction in the substrate by etching the first supporting material layer and the substrate, and filling a second insulating layer in each of the second trenches;
removing part of each of the second insulating layers to form a plurality of second grooves arranged in an array along the first direction and the second direction, wherein bottom surfaces of the second grooves are flush with the bottom surfaces of the first grooves; and
filling the second grooves to form a second supporting material layer, wherein the first supporting material layer and the second supporting material layer form the top supporting layer.

12. The method for manufacturing a semiconductor structure according to claim 11, wherein after the top supporting layer is formed, the method further comprises:
removing the remaining first insulating layers and the remaining second insulating layers to form a first filling region, wherein the first filling region exposes parts of sidewalls of the first semiconductor pillars to form the first oxide layers, the second oxide layer and the oxide pillars by the oxidation treatment; and
filling the first filling region with a sacrificial material after the oxidation treatment is completed, and exposing top surfaces of the first semiconductor pillars by removing part of the top supporting layer and part of the sacrificial material.

13. The method for manufacturing a semiconductor structure according to claim 12, wherein forming the memory structure surrounding sidewalls of first active pillars comprises:
removing the top supporting layer to expose parts of the first grooves and the second grooves;
removing the first oxide layers to form second filling regions;
filling a first conductive material in the first grooves, the second grooves and the second filling regions, wherein the first conductive material in the second filling regions forms first electrode layers; and
removing all of the sacrificial material to form a third filling region, forming a dielectric layer in the third filling region, and depositing a second conductive material on a surface of the dielectric layer to form a second electrode layer.

14. The method for manufacturing a semiconductor structure according to claim 13, wherein forming the plurality of second active pillars comprises:
removing the first conductive material and the second conductive material around a sidewall of a top of each of the first semiconductor pillars;
forming a first semiconductor substrate by epitaxial growth on the tops of the first semiconductor pillars;
forming a plurality of third trenches arranged at intervals along the first direction in the first semiconductor substrate;
forming a third insulating layer in each of the third trenches;
forming a first mask layer on the first semiconductor substrate, and forming a plurality of fourth trenches arranged at intervals along the second direction by the first mask layer, wherein the third trenches and the fourth trenches divide the first semiconductor substrate into a plurality of second semiconductor pillars;
forming a fourth insulating layer in each of the fourth trenches;
removing part of each of the third insulating layers and part of each of the fourth insulating layers to expose part of a sidewall of each of the second semiconductor pillars;
performing an oxidation treatment on the exposed sidewalls of the second semiconductor pillars, to oxidize the exposed sidewalls to form third oxide layers; and
removing the third oxide layers, wherein the exposed second semiconductor pillars form the second active pillars.

15. The method for manufacturing a semiconductor structure according to claim 14, wherein forming the plurality of the transistors comprises:
forming a gate oxide layer on part of the sidewall of each of the second active pillars;
filling a third conductive material in gaps between the second active pillars having the gate oxide layers;
removing part of the third conductive material by the first mask layer to form gates; and
forming a source and a drain respectively at two opposite ends of each of the second active pillars.

16. The method for manufacturing a semiconductor structure according to claim 8, wherein the method further comprises:
forming a plurality of bit lines above the second active pillars, wherein the plurality of the bit lines are in electrical contact with tops of the second active pillars.

* * * * *